US012813213B2

(12) United States Patent
Nguyen et al.

(10) Patent No.: US 12,813,213 B2
(45) Date of Patent: Nov. 24, 2026

(54) ELECTROSTATIC SUBSTRATE SUPPORT

(71) Applicant: Applied Materials, Inc., Santa Clara, CA (US)

(72) Inventors: Andrew Nguyen, San Jose, CA (US); Yogananda Sarode Vishwanath, Bangalore (IN); Tom K. Cho, Los Altos Hills, CA (US); Jennifer Y. Sun, Mountain View, CA (US); Xue Yang Chang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 411 days.

(21) Appl. No.: 18/210,328

(22) Filed: Jun. 15, 2023

(65) Prior Publication Data

US 2024/0420984 A1 Dec. 19, 2024

(51) Int. Cl.

| | |
|---|---|
| ***H10P 72/72*** | (2026.01) |
| ***H01J 37/32*** | (2006.01) |
| ***H10P 50/24*** | (2026.01) |
| ***H10P 72/10*** | (2026.01) |

(52) U.S. Cl.

CPC ........ *H10P 72/722* (2026.01); *H01J 37/3244* (2013.01); *H01J 37/32715* (2013.01); *H10P 50/242* (2026.01); *H10P 72/1912* (2026.01)

(58) Field of Classification Search

CPC .. H10P 72/722; H10P 50/242; H10P 72/1912; H10P 72/0434; H10P 72/72; H10P 72/7616; H01J 37/3244; H01J 37/32715

USPC .......................................................... 361/234

See application file for complete search history.

(56) References Cited

U.S. PATENT DOCUMENTS

| | | | | |
|---|---|---|---|---|
| 10,904,996 | B2 * | 1/2021 | Koh | H01J 37/32082 |
| 11,145,535 | B2 * | 10/2021 | Choi | B24B 37/30 |
| 11,217,470 | B2 * | 1/2022 | Taga | C23C 4/02 |
| 11,244,847 | B2 * | 2/2022 | Melikyan | H01J 37/244 |

(Continued)

FOREIGN PATENT DOCUMENTS

| | | | |
|---|---|---|---|
| CN | 114521289 | A | 5/2022 |
| CN | 114631166 | A | 6/2022 |

(Continued)

OTHER PUBLICATIONS

Office Action in Taiwanese Appln. No. 113115026, dated Nov. 22, 2024, 12 pages (with English summary and search report).

(Continued)

*Primary Examiner* — Dharti H Patel

(74) *Attorney, Agent, or Firm* — Fish & Richardson P.C.

(57) ABSTRACT

An electrostatic chuck (ESC) including a ceramic body having a first surface with two or more regions defined on the first surface arranged concentrically with respect to each other on the first surface. Each region includes a retaining ring arranged on the first surface and defining an outer edge of the region, and structures arranged on the first surface and within the region configured to support a surface of a substrate when the substrate is retained by the electrostatic chuck. The ESC includes gas conduits configured to introduce a gas into the two or more regions through the ceramic body and to the first surface, and embedded electrodes within the ceramic body and arranged with respect to the first surface and configured to generate a retaining force on the surface of the substrate.

31 Claims, 12 Drawing Sheets

(56) References Cited

U.S. PATENT DOCUMENTS

| | | | | |
|---|---|---|---|---|
| 11,574,798 | B2 * | 2/2023 | Koshimizu | H01J 37/32027 |
| 12,230,483 | B2 * | 2/2025 | Tanikawa | H01J 37/32568 |
| 12,261,028 | B2 * | 3/2025 | Takahashi | H01J 37/32642 |
| 12,341,048 | B2 * | 6/2025 | Sulyman | H01J 37/3244 |
| 12,390,842 | B2 * | 8/2025 | Jeong | B08B 3/02 |
| 12,400,839 | B2 * | 8/2025 | Ko | H01J 37/32091 |
| 12,412,769 | B2 * | 9/2025 | Sarode | H10P 72/0434 |
| 12,424,481 | B2 * | 9/2025 | Chadha | H10P 72/0432 |
| 12,427,550 | B2 * | 9/2025 | Huang | B08B 3/08 |
| 12,444,585 | B2 * | 10/2025 | Noujaim | H01J 37/32577 |
| 12,451,336 | B2 * | 10/2025 | Koiwa | H01J 37/32715 |
| 2011/0157760 | A1 | 6/2011 | Willwerth et al. | |
| 2016/0111315 | A1 | 4/2016 | Parkhe | |
| 2017/0133244 | A1 | 5/2017 | Knyazik et al. | |
| 2018/0122680 | A1 | 5/2018 | Yang | |
| 2018/0366361 | A1 | 12/2018 | Hwang | |
| 2019/0078206 | A1 | 3/2019 | Wu et al. | |
| 2020/0071832 | A1 | 3/2020 | Lau et al. | |
| 2020/0161165 | A1 | 5/2020 | Raj et al. | |
| 2021/0005494 | A1 | 1/2021 | Matyushkin et al. | |
| 2022/0181127 | A1 | 6/2022 | Erickson et al. | |
| 2022/0208592 | A1 | 6/2022 | Venkatraman et al. | |
| 2022/0216086 | A1 | 7/2022 | Ishikawa et al. | |
| 2023/0019718 | A1 | 1/2023 | Larosa et al. | |
| 2023/0170241 | A1 * | 6/2023 | Sulyman | H01J 37/3244 156/345.51 |
| 2024/0304486 | A1 * | 9/2024 | Sarode Vishwanath | H01J 37/3244 |
| 2024/0420932 | A1 | 12/2024 | Vishwanath et al. | |

FOREIGN PATENT DOCUMENTS

| | | | |
|---|---|---|---|
| CN | 114695044 | | 7/2022 |
| CN | 114695239 | A | 7/2022 |
| JP | 2018-026571 | A | 2/2018 |
| JP | 2020-107762 | A | 7/2020 |
| JP | 2023-065471 | A | 5/2023 |
| TW | 201923950 | A | 6/2019 |
| TW | 202236499 | A | 9/2022 |
| WO | WO 2003/009370 | A2 | 1/2003 |

OTHER PUBLICATIONS

Han et al., "Rapid multi-material 3D printing with projection micro-stereolithography using dynamic fluidic control," Additive Manufacturing, Feb. 11, 2019, (27):606-615.

International Search Report and Written Opinion in International Appln. No. PCT/US2024/025365, mailed on Aug. 2, 2024, 11 pages.

Nohut et al., "Lithography-based additive manufacturing of porosity graded alumina," Dec. 2022, Additive Manufacturing Letters, 3(4):100060, 6 pages.

Office Action in Korean Appln. No. 10-2025-7033950, mailed on Mar. 23, 2026, 42 pages (with English translation).

Third Party Observations in Korean Appln. No. 10-2025-7033950, mailed on Feb. 24, 2026, 4 pages (with machine translation).

Third Party Observations in Korean Appln. No. 10-2025-7033950, mailed on Oct. 14, 2026, 5 pages (with English machine translation).

* cited by examiner

FIG. 9D
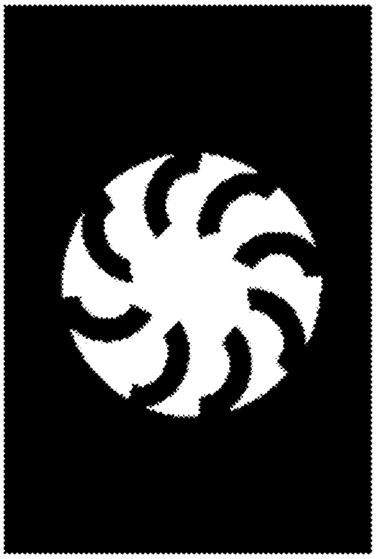
FIG. 9E
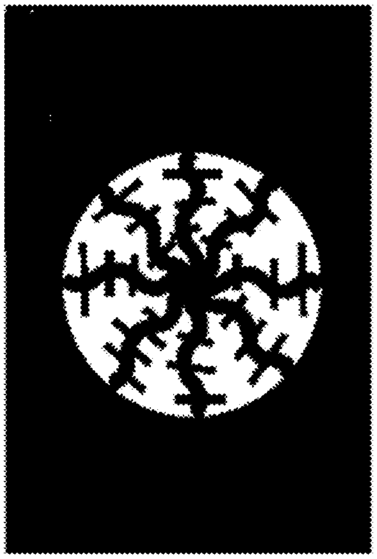
FIG. 9F
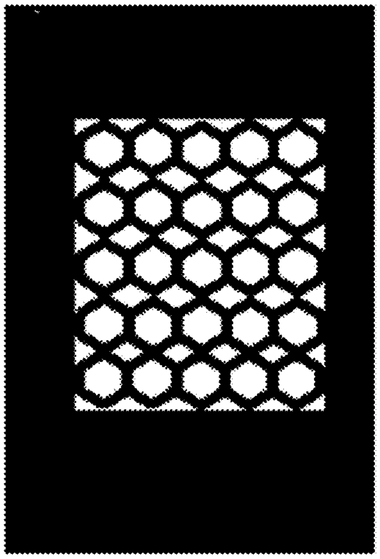
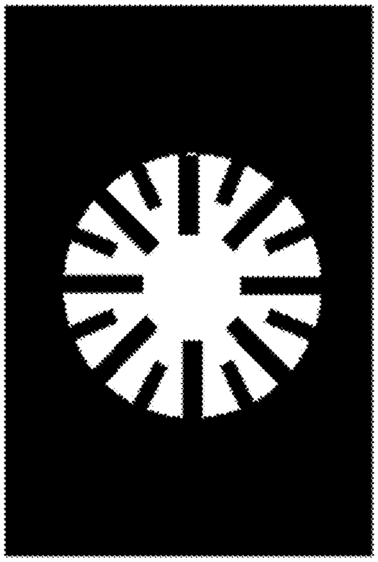
FIG. 9A
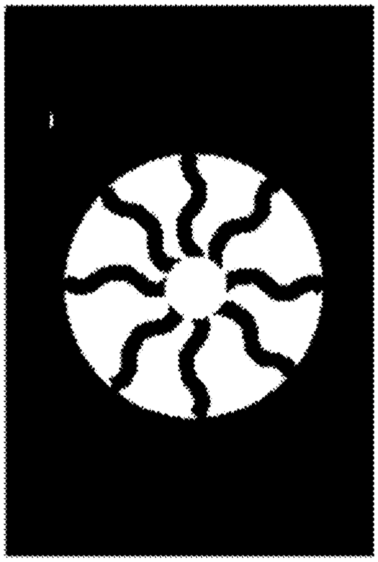
FIG. 9B
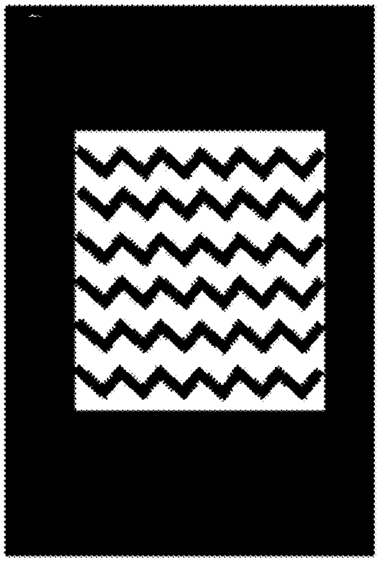
FIG. 9C

ELECTROSTATIC SUBSTRATE SUPPORT

CROSS-REFERENCE TO RELATED APPLICATIONS

This application claims the benefit of priority under 35 U.S.C. § 119 to Indian patent application No. 202341032416, filed on May 8, 2023, the contents of which are hereby incorporated by reference.

TECHNICAL FIELD

This specification relates to semiconductor systems, processes, and equipment.

BACKGROUND

Plasma etching can be used in semiconductor processing to fabricate integrated circuits. Integrated circuits can be formed from layer structures including multiple (e.g., two or more) layer compositions. Different etching gas chemistries, e.g., different mixtures of gases, can be used to form a plasma in the processing environment such that a given etching gas chemistry can have increased precision and higher selectivity for a layer composition to be etched. As scaling of integrated circuits continues to move towards smaller features and increased aspect ratios, there is a growing need for precision etching of layer structures.

SUMMARY

This specification describes technologies for electrostatic chucks and related components. These technologies generally involve using additive manufacturing techniques to design and fabricate electrostatic chucks for use in substrate processing chambers.

As used in this specification, a substrate refers to a wafer or another carrier structure, e.g., a glass plate. A wafer can include a semiconductor material, e.g., Silicon, GaAs, InP, or another semiconductor-based wafer material. A wafer can include an insulator material, for example, silicon-on-insulator (SOI), diamond, etc. At times, the substrate includes film(s) formed on a surface of the wafer/carrier structure. The film(s) can be, for example, dielectric, conductive, or insulating films. The film(s) can be formed on the surface of the wafer using various deposition techniques, for example, spin-coating, atomic layer deposition (ALD), chemical vapor deposition (CVD), metal-organic chemical vapor deposition (MOCVD), molecular beam epitaxy (MBE), or other similar techniques for forming thin film layers on a wafer or another carrier structure. In some embodiments, the fabrications tools described in this specification are plasma-based etching tools, where etch processes can be performed on the formed layers on the surface of the wafer/carrier structure and/or on the wafer.

In general, one innovative aspect of the subject matter described in this specification can be embodied in an electrostatic chuck (ESC) structure embodied in a machine-readable medium for designing, manufacturing, or testing a design. The ESC includes a ceramic body having a first surface and two or more regions defined on the first surface, where the two or more regions are arranged concentrically with respect to each other on the first surface. Each region includes a retaining ring arranged on the first surface and defining an outer edge of the region, and multiple structures arranged on the first surface and within the region, the multiple structures configured to support a surface of a substrate when the substrate is retained by the electrostatic chuck. The ESC can include a sensor embedded within a portion of the ceramic body, where a portion of the sensor is arranged with respect to the first surface of the ceramic body, and where the sensor is configured to collect a measurement of the surface of the substrate (e.g., a direct or an indirect measurement of the surface of the substrate) when the substrate is retained by the electrostatic chuck. The ESC includes one or more gas conduits configured to introduce a gas into the two or more regions through the ceramic body and to the first surface, where the two or more regions are configured to retain a positive gas pressure within a respective region and the surface of a substrate when the substrate is retained by the electrostatic chuck. The ESC includes one or more embedded electrodes within the ceramic body and arranged with respect to the first surface, wherein the one or more electrodes are configured to generate a retaining force on the surface of the substrate when the substrate is retained by the electrostatic chuck.

Other embodiments of this aspect include corresponding methods, computer systems, apparatus, and computer programs recorded on one or more computer storage devices.

In general, another innovative aspect of the subject matter in this specification can be embodied in a method of manufacturing an electrostatic chuck (ESC) structure. The method includes forming, by an additive manufacturing system, multiple layers, the multiple layers including a ceramic body having a first surface, two or more regions defined on the first surface, where the two or more regions are arranged concentrically with respect to each other on the first surface, and where region includes a retaining ring arranged on the first surface and defining an outer edge of the region, and multiple supportive structures arranged on the first surface and within the region and configured to support a surface of a substrate when the substrate is retained by the electrostatic chuck. The multiple layers include gas conduits configured to introduce a gas into the two or more regions through the ceramic body and to the first surface. The method includes, during the forming of the multiple layers, embedding one or more embedded electrodes within the ceramic body and arranged with respect to the first surface, and embedding a sensor within a portion of the ceramic body, where a portion of the sensor is arranged with respect to the first surface of the ceramic body.

Other embodiments of this aspect include corresponding systems, computer systems, apparatus, and computer programs recorded on one or more computer storage devices, each configured to perform the actions of the methods.

The subject matter described in this specification can be implemented in these and other embodiments so as to realize one or more of the following advantages. Using additive manufacturing (AM) techniques to manufacture electrostatic chucks (ESCs) can overcome challenges in the methods to manufacture the ESCs, improve yield and increase complexity, as well as open up material possibilities. Design flexibility for embedded electrodes within the ceramic body of the ESC that are used to apply a chucking force or to generate local heating can be improved using AM. For example, AM can open up a design space for features of the ESC. For example, AM can be used to open a design space for embedded electrodes such as placement/alignment, dimensions, and shape of the electrodes. In another example, AM can be used to introduce features otherwise unavailable or cost-prohibited by traditional, non-AM techniques, e.g., embedded sensors, complex internal channels/conduits, etc. AM techniques can be used to open a design space for supportive structures, e.g., mesa structures, on a surface of the ESC. For example, AM can be used to form mesa structures that would otherwise be cost-prohibitive or unattainable using traditional, non-AM techniques, e.g., tapered mesa structures.

AM-specific design can be used to control a heat transfer coefficient between a substrate and the ESC with selection of one or more of a type, shape, distribution (e.g., a pattern), density, and size of mesas depending on process requirements of a chamber and/or fabrication process. For example, tapered mesa design can be used to reduce contact area with the substrate (low contact area) and increase a volume available for backside cooling gas for convective heat transfer and conductance with the substrate. In another example, diagnostics capability and closed loop control of ESC parameters and monitoring performance can be improved using AM techniques.

AM techniques can result in improved control over fidelity (e.g., defect reduction) of manufactured parts resulting in better performance of the manufactured parts, e.g., reduced helium leaks, improved capacitance, tighter (critical) dimensional control, reduced cracking due to machining, etc. For example, AM can be used to improve planarity of the embedded electrodes that can be challenging using traditional non-AM techniques, which can improve the performance of the embedded electrodes operating as chucking electrodes by improving the parallel capacitance generated by the embedded electrodes.

Additionally, AM techniques can be used to refurbish/regrow/modify existing ESCs, which can result in increased lifetime of ESC components and decreased costs by reusing rather than full replacement. The refurbishment/modification process can target localized degradation, e.g., due to use in a process environment and exposure to plasma and etch chemistries, in order to restore functionality of the ESC for continued target performance and use. Localized AM-based regrowth techniques for refurbishment can reduce cost, material consumption, and time for the refurbishment. Additionally, refurbishments/modification can be used to update an existing component rather than fabricating a completely new component to incorporate a new feature.

Although the remaining disclosure will identify specific processes for etch-based fabrication tools using the disclosed technology, it will be readily understood that the systems and methods are equally applicable to a variety of other fabrication tools and chambers. Accordingly, the technology should not be considered to be so limited as for use with the described etching fabrication tools alone. The disclosure will discuss one possible system and chamber that can be used with the present technology before describing systems and methods or operations of exemplary process sequences according to some embodiments of the present technology. It is to be understood that the technology is not limited to the equipment described, and processes discussed can be performed in any number of processing chambers and systems.

BRIEF DESCRIPTION OF THE DRAWINGS

FIGS. 9A-9F show various example cross-sectional schematic views of cooling channels.

Like reference numbers and designations in the various drawings indicate like elements.

DETAILED DESCRIPTION

The present specification provides improved methods and assemblies for using additive manufacturing for fabricating an electrostatic chuck (ESC) for use in substrate processing chambers. Embodiments of the present disclosure include electrostatic chuck design enabled by additive manufacturing, where design parameters for the ESC can depend on design window of the additive manufacturing system and process.

Figure 1:
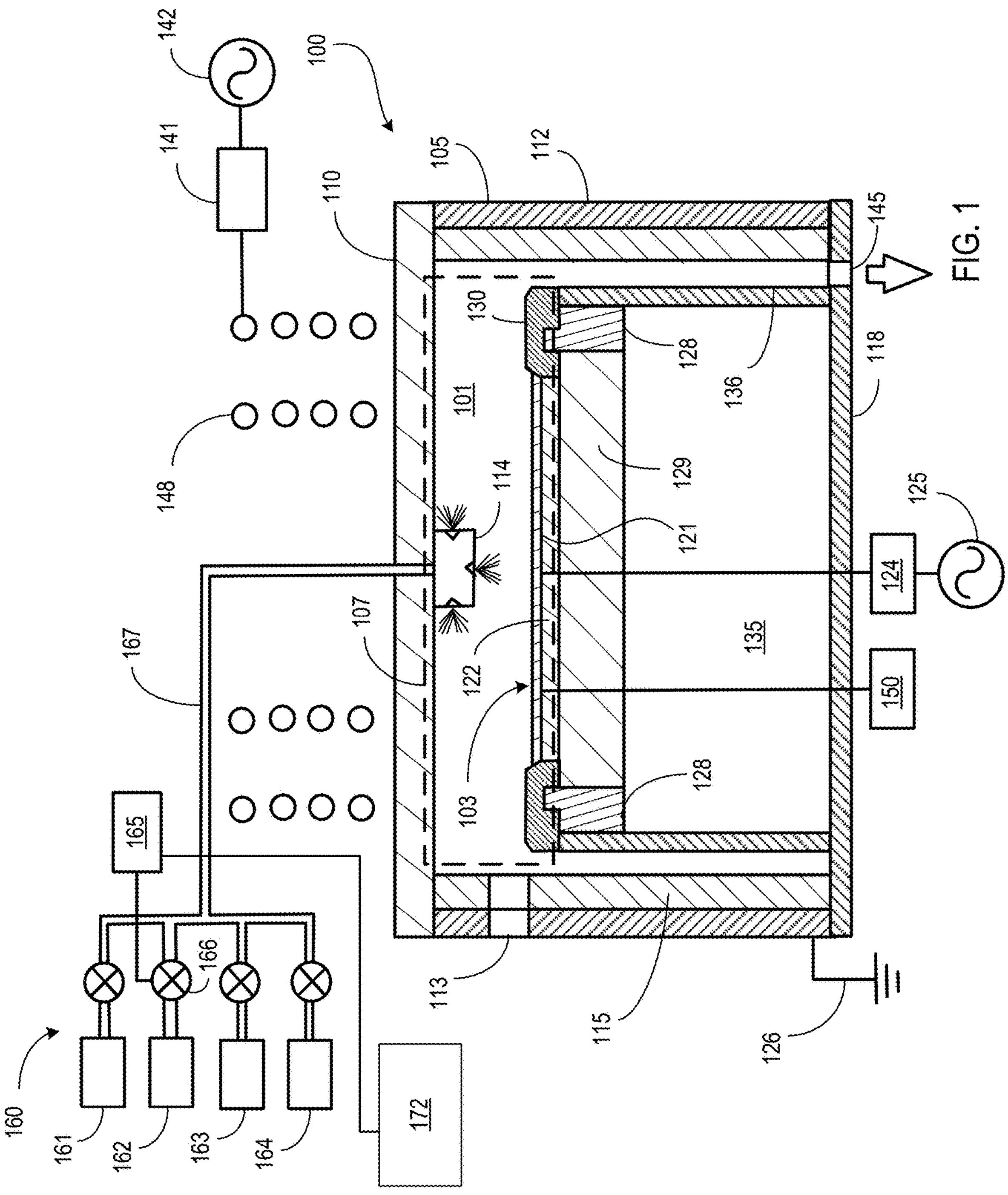
FIG. 1 shows a schematic cross-sectional view of an example plasma processing chamber.

FIG. 1 illustrates a schematic cross-sectional view of an example processing chamber 100 suitable for etching one or more material layer(s) disposed on a substrate 103 (e.g., also referred to as a “wafer”) in the processing chamber 100, e.g., a plasma processing chamber. The processing chamber 100 includes a chamber body 105 defining a chamber volume 101 in which a substrate can be processed. The chamber body 105 has sidewalls 112 and a bottom 118 which are coupled with ground 126. The sidewalls 112 can include a liner 115 to protect the sidewalls 112 and extend the time between maintenance cycles of the plasma processing chamber 100. The chamber body 105 is supportive of a chamber lid assembly 110 to enclose the chamber volume 101. The chamber body 105 can be fabricated from, for example, ceramic, aluminum or other suitable materials. A substrate access port 113 is formed through the sidewall 112 of the chamber body 105, which can facilitate the transfer of the substrate 103 into and out of the plasma processing chamber 100. Access port 113 can be coupled with a transfer chamber and/or other chambers (not shown) of a substrate processing system, e.g., to perform other processes on the substrate. A pumping port 145 is formed through the bottom 118 of the chamber body 105 and connected to the chamber volume 101. A pumping device can be coupled through the pumping port 145 to the chamber volume 101 to evacuate and control the pressure within the processing volume. The pumping device can include one or more pumps and throttle valves.

Chamber volume 101 includes a processing region 107, e.g., a station for processing a substrate. A substrate support 135 can be disposed in the processing region 107 of chamber volume 101 to support the substrate 103 during processing. The substrate support 135 can include an electrostatic chuck 122 for holding the substrate 103 during processing. The electrostatic chuck (“ESC”) 122 can use electrostatic attraction to hold the substrate 103 to the substrate support 135. The ESC 122 can be powered by an RF or DC power supply 125 integrated with a match circuit 124. The ESC 122 can include an electrode 121 embedded within a dielectric body. The electrode 121 can be coupled with the RF or DC power supply 125 and can provide a bias which attracts plasma ions, formed from the process gases in the chamber volume 101, to the ESC 122 and substrate 103 seated on the pedestal. The RF or DC power supply 125 can cycle on and off, or pulse, during processing of the substrate 103. The ESC 122 can have an isolator 128 for the purpose of making the sidewall of the ESC 122 less attractive to the plasma to prolong the maintenance life cycle of the ESC 122. Additionally, the substrate support 135 can have a cathode liner 136 to protect the sidewalls of the substrate support 135 from the plasma and to extend the time between maintenance of the plasma processing chamber 100.

Electrode 121 can be coupled with a DC power source 150. The power source 150 can provide a chucking voltage of about 5000 volts to about-5000 volts to the electrode 121. The power source 150 can also include a system controller for controlling the operation of the electrode 121 by directing a DC current to the electrode 121 for chucking and de-chucking the substrate 103. The ESC 122 can include heaters disposed within the ceramic and connected to a power source for heating the substrate, while a cooling base 129 supporting the ESC 122 can include conduits for circulating a heat transfer fluid to maintain a temperature of the ESC 122 and substrate 103 disposed thereon. The ESC 122 can be configured to perform in the temperature range required by the thermal budget of the device being fabricated on the substrate 103. For example, the ESC 122 can be configured to maintain the substrate 103 at a temperature of about −150° C. or lower to about 500° C. or higher depending on the process being performed. A cover ring 130 can be disposed on the ESC 122 and along the periphery of the substrate support 135. The cover ring 130 can be configured to confine etching gases to a desired portion of the exposed top surface of the substrate 103, while shielding the top surface of the substrate support 135 from the plasma environment inside the plasma processing chamber 100.

A gas panel 160 (e.g., also referred to herein as "gas distribution manifold") can be coupled by a gas line 167 with the chamber body 105 through chamber lid assembly 110 to supply process gases into the chamber volume 101. The gas panel 160 can include one or more process gas sources 161, 162, 163, 164 and can additionally include inert gases, non-reactive gases, and reactive gases, as can be used for any number of suitable processes. Examples of process gases that can be provided by the gas panel 160 include, but are not limited to, hydrocarbon containing gases including methane, sulfur hexafluoride, silicon chloride, silicon tetrachloride, carbon tetrafluoride, hydrogen bromide. Process gases that can be provided by the gas panel can include, but are limited to, argon gas, chlorine gas, nitrogen, helium, or oxygen gas, sulfur dioxide, as well as any number of additional materials. Additionally, process gasses can include nitrogen, chlorine, fluorine, oxygen, or hydrogen containing gases including, for example, $BCl_3$, $C_2F_4$, $C_4F_8$, $C_4F_6$, $CHF_3$, $CH_2F_2$, $CH_3F$, $NF_3$, $NH_3$, $CO_2$, $SO_2$, CO, $N_2$, $NO_2$, $N_{20}$, and $H_2$, among any number of additional suitable precursors. Process gases from process gas sources, e.g., sources 161, 162, 163, 164, can be combined to form one or more etching gas mixtures. For example, gas panel 160 includes one or more process gas sources specific to oxide-based etching chemistries. In another example, gas panel 160 includes one or more process gas sources specific to nitride-based etching chemistries.

Gas panel 160 includes various valves, pressure regulators (not shown), and mass flow controllers (not shown) arranged with respect to the gas sources 161, 162, 163, 164 to control the flow of the process gases from the sources. Valves 166 can control the flow of the process gases from the sources 161, 162, 163, 164 from the gas panel 160. Operations of the valves, pressure regulators, and/or mass flow controllers can be controlled by a controller 165. Controller 165 can be operably coupled to an electro-valve (EV) manifold (not shown) to control actuation of one or more of the valves, pressure regulators, and/or mass flow controllers. The lid assembly 110 can include a gas delivery nozzle 114. The gas delivery nozzle 114 can include one or more openings for introducing the process gases from the sources 161, 162, 163, 164 of the gas panel 160 into the chamber volume 101. After the process gases are introduced into the plasma processing chamber 100, the gases can be energized to form a plasma. An antenna 148, such as one or more inductor coils, can be provided adjacent to the plasma processing chamber 100. An antenna power supply 142 can power the antenna 148 through a match circuit 141 to inductively couple energy, such as RF or DC energy, to the process gas to maintain a plasma formed from the process gas in the chamber volume 101 of the plasma processing chamber 100. Alternatively, or in addition to the antenna power supply 142, process electrodes below the substrate 103 and/or above the substrate 103 can be used to capacitively couple RF or DC power to the process gases to maintain the plasma within the chamber volume 101. The operation of the power supply 142 can be controlled by a controller, such as controller 165, that also controls the operation of other components in the plasma processing chamber 100.

The controller 165 can be used to control the process sequence, regulating the gas flows from the gas panel 160 into the plasma processing chamber 100, and other process parameters. Software routines, when executed by a computing device having one or more processors (e.g., a central processing unit (CPU)) in data communication with one or more memory storage devices, transform the computing device into a specific purpose computer such as a controller, which can control the plasma processing chamber 100 such that the processes are performed in accordance with the present disclosure. The software routines can also be stored and/or executed by one or more other controller(s) that can be associated with the plasma processing chamber 100.

In some embodiments, controller 165 is in data communication with a characterization device 172. Characterization device 172 can include one or more sensors (e.g., image sensors) operable to collect processing data related to processing chamber 100. For example, characterization device 172 includes an optical emission spectroscopy device configured to monitor a signal, e.g., emitted light of a plasma, within a processing region of the processing chamber 100. For example, a signal can be a primary or highest intensity wavelength of emitted light. Characteristics of the emitted light (e.g., wavelength and intensity) from the plasma within the processing region can depend in part on an etching gas mixture used to generate the plasma as well as a layer composition of the layer being etched. For example, each etching gas mixture and corresponding layer composition being etched can have a respective signal signature. Emitted wavelengths that are unique or distinguishing for each etching gas mixture and corresponding layer composition can be monitored to determine an etching condition of the layer being etched. For example, a thickness remaining of the layer being etched. Characteristics of the emitted light from the plasma can change, e.g., based on the etching process. For example, an intensity of a monitored signal can change as material is removed from the layer being processed. Characterization device 172 can be configured to collect processing data including the respective signals corresponding to the etching gas mixtures utilized in the wafer processing and corresponding layer compositions of the structure being processed in the processing chamber 100. Controller 165 can receive processing data from the characterization device 172 and determine, from the processing data, one or more actions to perform.

In some embodiments, at a termination point of etching process(es) for the wafer, an automatic or semi-automatic robotic manipulator (not shown) can be utilized to transfer the wafer(s) from the substrate support out of the process chamber, e.g., through substrate access port 113. For example, the robotic manipulator can transfer the wafer to another chamber (or another location) to perform another step in a fabrication process.

In some embodiments, an ESC design can be selected to improve process uniformity across a substrate includes adapting various design parameters for the ESC. Relationships between the various design parameters in an ESC design can be complex, where a design parameter may affect one or more other design parameters. Adapting the various design parameters into an ESC design can yield a unique solution for an ESC to improve process uniformity (e.g., temperature uniformity) across a substrate during a fabrication process. Moreover, as discussed in further detail below, AM techniques can be used instead of, or in addition to, traditional, non-AM manufacturing techniques to expand a design window of what fabricated ESC designs are possible to implement.

Figure 2A:
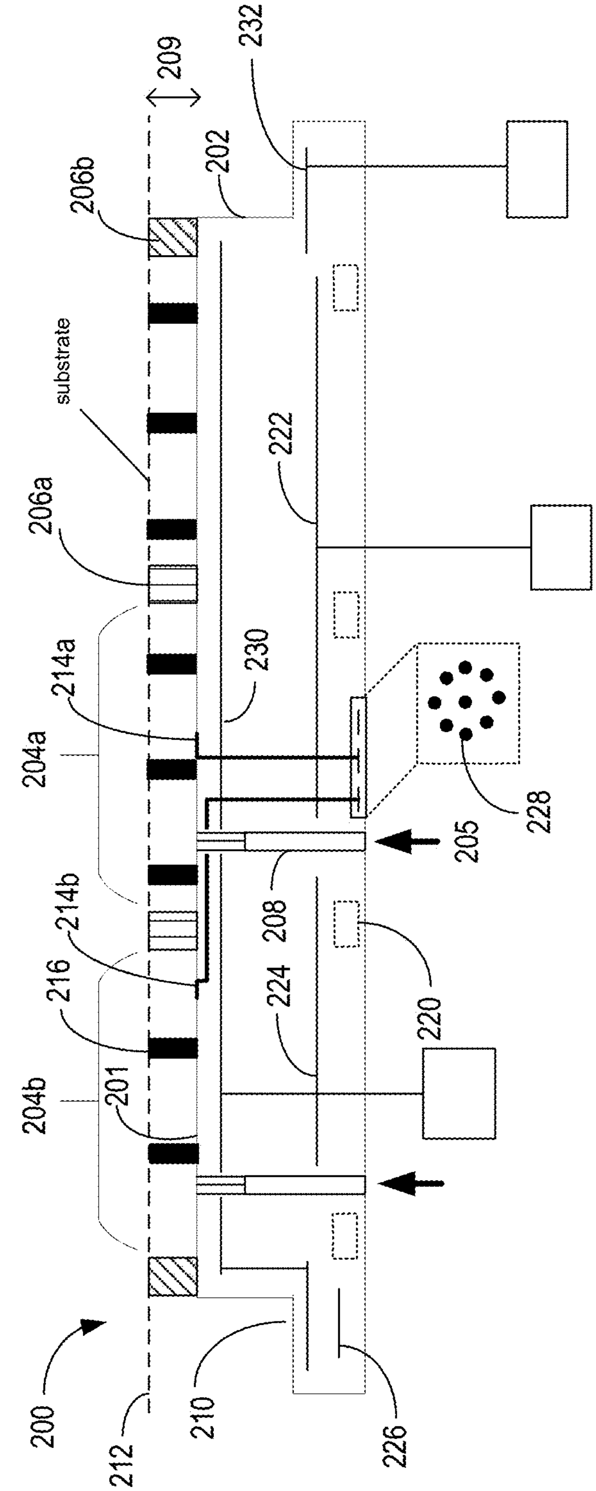
FIGS. 2A-2D show various example schematic views of portions of an electrostatic chuck for substrate processing.
Figure 2C:
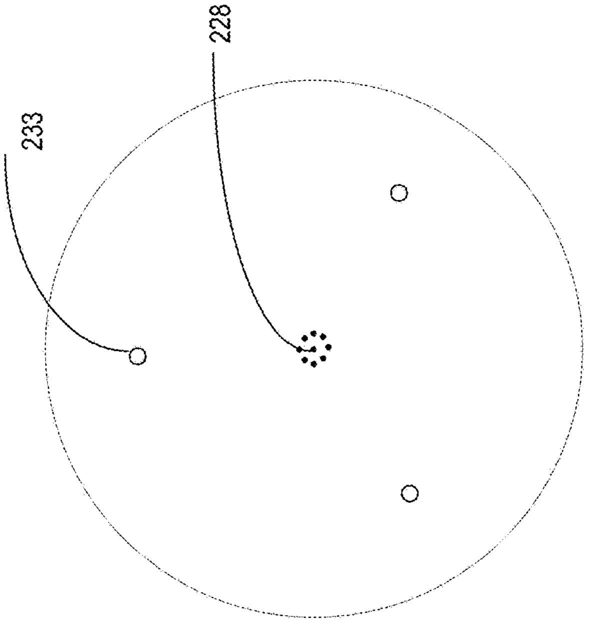

FIGS. 2A-2D show various views of an example electrostatic chuck (ESC) for substrate processing. FIG. 2A shows a cross-sectional view of an example portion of an ESC 200. ESC 200 includes a ceramic body 202 having a top surface 201. A number of cooling regions are arranged on the top surface 201, e.g., an inner cooling region **204*a* and an outer cooling region 204*b*. The one or more cooling regions each have an outer edge defined by a respective retaining ring 206*a*, 206*b* formed on the top surface 201 of the ESC 200. In some implementations, the retaining ring(s) 206*a*, 206*b* are formed on the top surface of a same ceramic material composition as the ceramic body of the ESC. For example, the retaining ring(s) 206*a*, 206*b* and ceramic body 202** can be formed as a single body using subtractive manufacturing of a ceramic body and/or additive manufacturing.

A gas (e.g., helium) can be introduced through gas conduits, e.g., gas conduit 208. A portion of the gas conduit(s) are arranged within the ceramic body 202 and are configured to facilitate a flow of gas through the ceramic body of the ESC 200 and into the cooling region(s) **204*a*, 204*b* to provide cooling to a portion of the substrate corresponding to the cooling regions. Gas conduits, e.g., gas conduit 208**, can include a porous plug. A porous plug can be composed of a different material composition and/or have different internal structure (e.g., porosity) than the ceramic body of the ESC. The porous plug can be configured to allow a flow of gas through the porous plug to the top surface of the ceramic body and restrict (e.g., prevent) contaminants from the top surface of the ceramic body from backflowing into the gas conduit. The gas conduits can include gas holes, e.g., laser-drilled or AM-defined holes, located in the gas flow path between the porous plug and the top surface of the ceramic body. The gas holes can be configured to allow a flow of gas through the gas holes and to the surface of the ceramic body, but restrict (e.g., prevent) contaminants from the top surface of the ceramic body from backflowing into the gas conduit.

A positive pressure of gas can be introduced into each of the multiple cooling regions, where the pressure of the introduced gas can be separately (e.g., independently) controlled. Independent control of the pressure of gas to each of the multiple cooling regions can include control of gas flow using flow meters and valves (not shown), to provide a same or different gas pressure to each of the multiple cooling regions. In some embodiments, controlling the pressure of the gas to a given cooling region controls a degree of cooling applied to a portion of the substrate corresponding to the cooling region. At times, a different amount of cooling can be applied to different portions of the substrate corresponding to different cooling regions by a controller operating the pressure of gas to each cooling region.

A top surface 201 of a ceramic body 202 includes an edge region 210 located outside the retaining ring **206*b* and not included within a cooling regions 204*a*, 204*b*. Retaining rings 206*a*, 206*b* are arranged concentrically with respect to a center point of the top surface 201 of the ESC 200. Although depicted in FIGS. 2A, 2B as evenly spaced, the retaining rings can be unevenly spaced apart. A height 209 of each retaining ring 206*a*, 206*b* is substantially equal from top surface 201 to a plane 212, such that when a substrate is retained by the ESC 200 at plane 212, an airtight seal is formed in each cooling region 204*a*, 204*b*. In other embodiments, an ESC may not include an edge region 210**.

An inner cooling region **204*a* defined by retaining ring 206*a* encloses a circular volume, where, when a substrate is retained by the ESC 200, a volume is defined by the inner surface of the retaining ring 206*a*, the top surface 201 of the ESC 200, and a backside of the substrate aligned on a plane 212, e.g., as depicted in FIG. 2A in a partial cross-sectional view of ESC 200**.

Figure 4C:
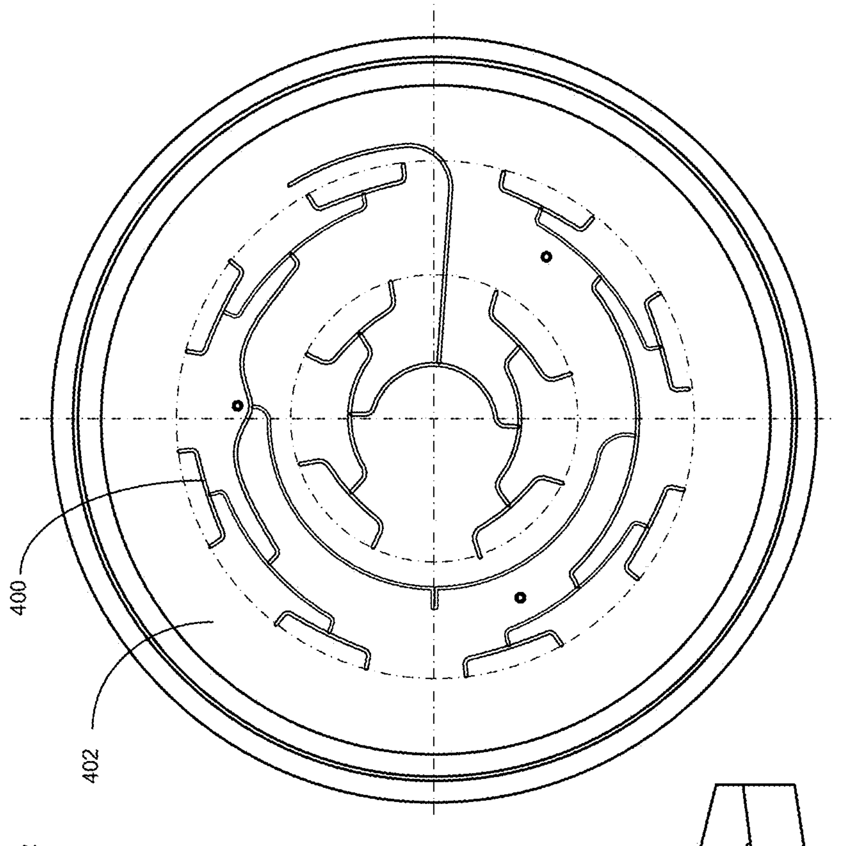
FIG. 4A-4C show various example schematic views of portions of an electrostatic chuck for substrate processing.
Figure 4A:
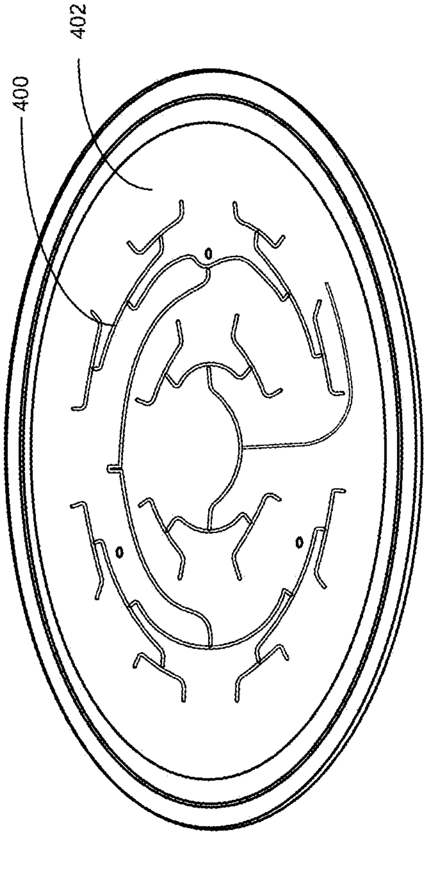
Figure 4B:
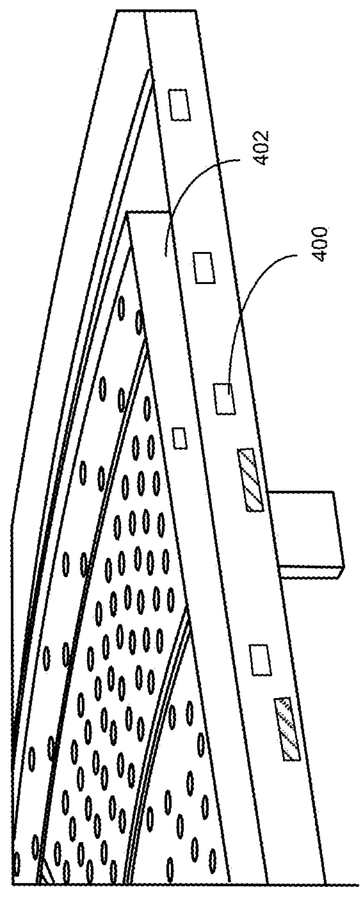

Cooling regions are coupled to one or more gas conduits, e.g., gas conduits 208, partially embedded within the ceramic body 202 of the ESC 200 and configured to introduce gas, e.g., gas flow 205, into each of the cooling regions. Though depicted in FIG. 2A as a respective gas conduit in each cooling region, a cooling region may have two or more gas conduits introducing gas into the cooling region, for example, as depicted in FIGS. 4A-4C. The gas conduits can introduce helium or another gas into each of the cooling regions. The gas pressure within the cooling regions can operate in a conductance zone, for example, low to negligible turbulence introduced into the cooling region by the gas when operating in a steady-state condition. A gas pressure for a cooling region can be selected based in part on a thermal conductivity requirement for the cooling region. For example, a higher gas pressure introduced into a cooling region can generate a larger thermal conductivity than a lower gas pressure, for a given gas.

The volumes defined in each of the cooling regions are substantially gas-tight and can hold positive pressure for a duration of time. Positive pressure can include between about 1 Torr and about 50 Torr. For example, positive pressure can include at least about 2 Torr, 5 Torr, 10 Torr, 15 Torr, 20 Torr, 25 Torr, or more. A positive pressure can be based on an amount of chucking force exerted on the backside of the substrate by electrode 230. For example, the positive pressure can be selected to exert less force on the backside of the substrate than a chucking force exerted between the electrode and the backside of the wafer during a fabrication process.

In some embodiments, ESC 200 includes one or more sensors, e.g., sensor **214*a*, 214*b*, configured to capture a temperature measurement. A portion of sensor 214*a* can be embedded within ceramic body 202 of ESC 200. A portion of sensor 214***a* can be in contact with top surface 201 of the ceramic body 202 and can be configured to collect (e.g., direct) measurements of the top surface 201 and/or of a backside surface of a substrate retained by the ESC 200 at plane 212. For example, sensors 214*a*, 214*b* can be temperature measurement sensors, e.g., a thermocouple. Temperature measurements at the backside of the substrate can have improved accuracy and may be less prone to line-of-sight issues associated with optic probes. Sensors 214*a*, 214*b* can be configured to directly measure a temperature of top surface 201 and/or of ceramic body 202 in a same or different cooling regions. In another example, sensors 214*a*, 214*b* can be configured to measure (e.g., non-contact) temperature of a backside of a substrate retained by the ESC 200. In another example, sensors 214*a*, 214*b* can be configured to measure (e.g., contact) temperature of the backside of the substrate retained by ESC 200.

In some embodiments, ESC 200 includes one or more sensors, e.g., sensors 214*a*, 214*b* configured to capture measurements related to a state of the substrate retained by the ESC. For example, a sensor 214*a* can be an acoustic emission sensor configured to measure acoustic feedback from a backside of the substrate. Acoustic emission sensor (s) can be embedded at various points within the ESC 200 such that acoustic feedback can be measured at different points, for example, to determine structural integrity of the substrate (e.g., if the substrate has broken), and/or if a portion of the ESC ceramic has cracked. The embedded sensors can be used to provide feedback to the fabrication tool to prevent contamination of the fabrication process that may result when a substrate breaks during the fabrication process. In another example, sensor 214*a*, 214*b* can be a voltage sensor or charge sensor configured to measure a residual charge on the substrate in order to know when the substrate is sufficiently discharged during a dechucking process and can be safely lifted without risk of breaking.

In some embodiments, the ESC 200 can include a sensor where a portion of the sensor includes a printed circuit. The printed circuit of the sensor can be printed directly into/onto the ceramic body, e.g., using additive manufacturing techniques, screen printing, deposition, etc.

In some embodiments, cooling regions 204*a*, 204*b* include one or more supportive structures, e.g., supportive structure 216. The supportive structures, e.g., mesas, are arranged on the top surface 201 of the ceramic body 202 and extending to plane 212, e.g., a height 209. The height 209 of the supportive structures can be (e.g., substantially) of equal height and additionally (e.g., substantially) equal to height of the retaining rings 206*a*, 206*b* such that the supportive structures each contact a backside surface of the substrate when the substrate is retained by the ESC 200.

In some embodiments, a density of supportive structures in a cooling region can be above a threshold density such that the cooling of the cooling region is contact-dominated in that region. In other words, the dominant contributor to cooling in the region is localized to the points of contact between the supportive structures and the retaining rings, and the backside of the substrate when the substrate is retained by the ESC. In a contact-dominated cooling regime, the gas cooling mechanism is a secondary cooling mechanism for that cooling region.

In some embodiments, one or more of the cooling regions can include a non-uniform distribution of the supportive structures. FIG. 3 depicts a cooling region including a gradient 304 of a density of the supportive structures, e.g., tapered mesa 302, arranged with respect to the top surface 301 of the ceramic body 306 of the ESC 300. A higher density of supportive structures can be located adjacent to one or more retaining rings bounding the cooling region and graduate to a lower density of supportive structures in a central region of the cooling region. Gradients of density of the supportive structures can reduce a sharpness of a boundary between contact-dominated cooling at the retaining ring to the gas-dominated cooling in a central region of the cooling zone. Although depicted in FIGS. 2A and 2B as a sparse distribution of supportive structures, e.g., supportive structure 216, the supportive structures may be evenly or unevenly distributed within the cooling regions 204*a*, 204*b* and with respect to the retaining rings 206*a*, 206*b*.

Figure 2B:
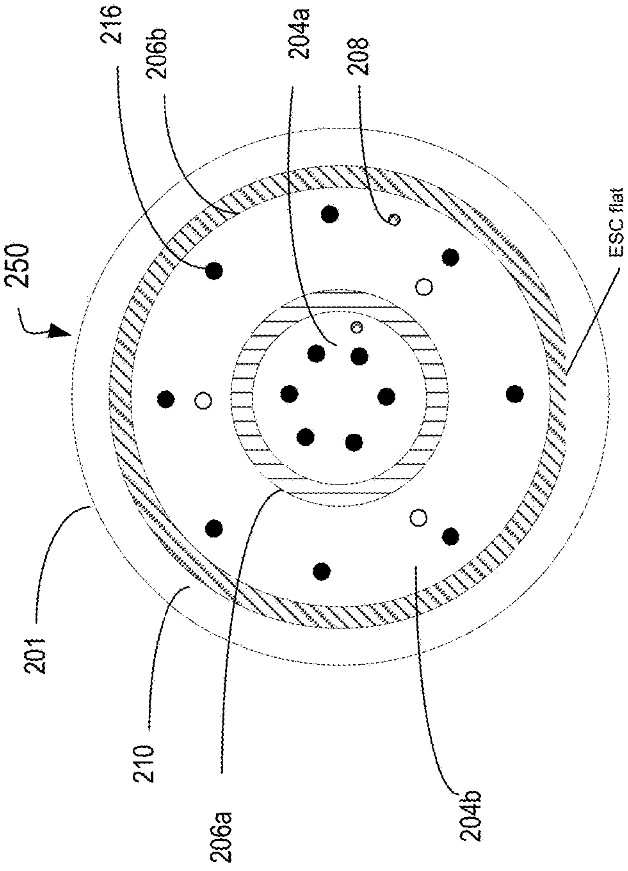
Figure 3:
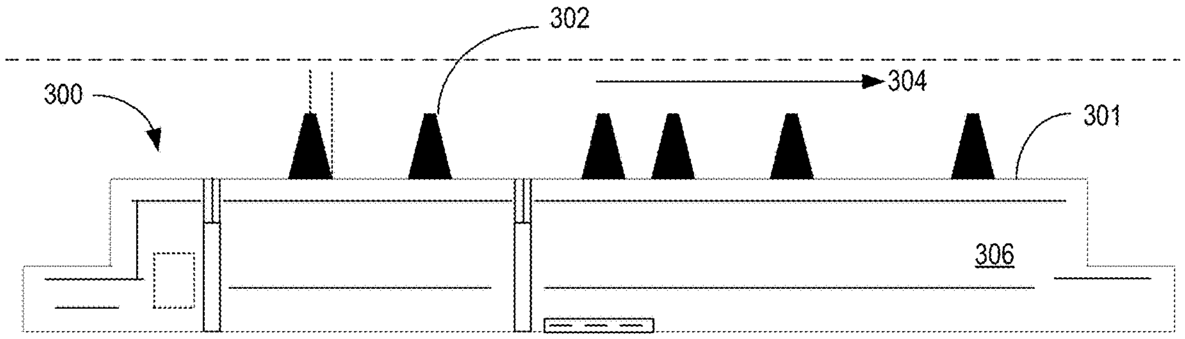
FIG. 3 shows an example schematic view of a portion of an electrostatic chuck for substrate processing.

In some embodiments, supportive structure(s) 216 include a cylindrical shape, with a circular cross-section parallel to the top surface of the ceramic body of the ESC, e.g., as depicted in FIGS. 2A and 2B. A minimum density of supportive structures in a cooling region can be set based on a number of supportive structures required to maintain at least a threshold flatness of a substrate when the substrate is retained by the ESC. For example, a minimum density of supportive structures in a cooling region can be set to prevent bowing or flexing of the substrate when the substrate is chucked/de-chucked, e.g., by electrode 121.

In some embodiments, other cross-sectional shapes may be possible, for example, rectangular, polygonal, and the like. In some embodiments, a combination of two or more different types of shapes can be used, e.g., each cooling region having a respective type of shape, or a mix of two or more types of shapes in a cooling region. In some embodiments, supportive structures can include tapered structures, e.g., tapered mesas. For example, a supportive structure may have a first diameter at a base of the supportive structure contacting a top surface of the ceramic body of the ESC, and a second, smaller diameter at a contact point where the supportive structure contacts a backside surface of the substrate when the substrate is retained by the ESC.

Cooling regions 204*a*, 204*b* include one or more gas conduits, e.g., gas conduit 208, within the ceramic body of the ESC and which are configured to introduce gas, e.g., gas flow 205, into each of the cooling regions. Though depicted in FIG. 2A as a respective gas conduit in each cooling region, a cooling region may have two or more gas conduits introducing gas into the cooling region. For example, the gas conduits can introduce helium or another inert gas into each of the cooling regions.

In some embodiments, as depicted in FIGS. 4A-4C, gas conduits, e.g., gas conduit 400 can be embedded within the ceramic body 402 of the ESC. Gas conduits can include an embedded branching structure, where each originating conduit, e.g., from a plenum, can branch one or more times within the ceramic body to introduce gas into the cooling regions at two or more points. For example, as depicted in FIGS. 4A and 4C, a gas conduit 400 can branch at least four times to generate 16 outlets of the gas conduit to the top surface of the ceramic body. FIG. 4B depicts a partial cross-sectional view of a ceramic body 402 including embedded gas conduits, e.g., gas conduit 400. The gas conduits can be embedded into the ceramic body such that a portion of the gas conduit traverses laterally through the ceramic body and parallel to a top surface of the ceramic body.

In some embodiments, as depicted in FIG. 3, one or more of the cooling regions can include different densities of supportive structures. A density of supportive structures in a cooling region can be below a threshold density such that the cooling of the cooling region is gas-dominated in that region. In other words, the dominant contributor to cooling in the cooling region is due to the positive gas pressure, e.g., helium pressure, introduced by gas conduits into the cooling region when a substrate is retained by the ESC. In a gas-dominated cooling regime, the contact points between the supportive structures and retaining rings and the backside of the substrate when the substrate is retained by the ESC is a secondary cooling mechanism for the cooling region.

Figure 11B:
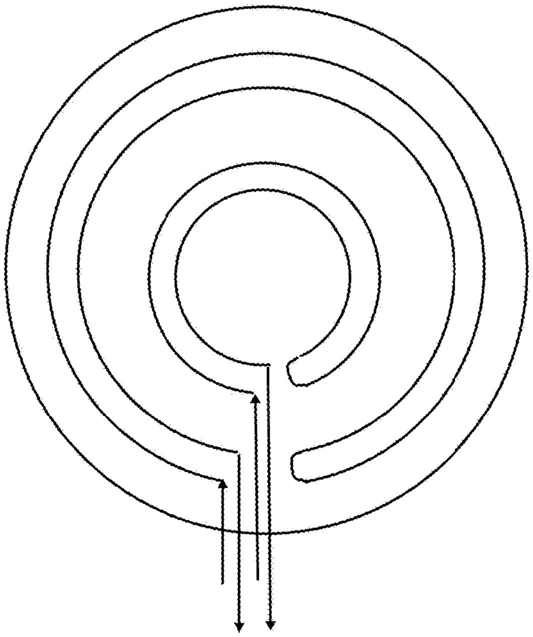
FIGS. 11A-11C show various example plan-view schematic views of cooling channels.
Figure 11C:
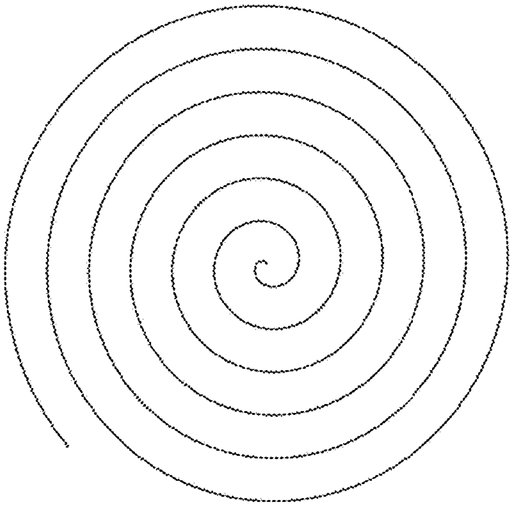
Figure 11A:
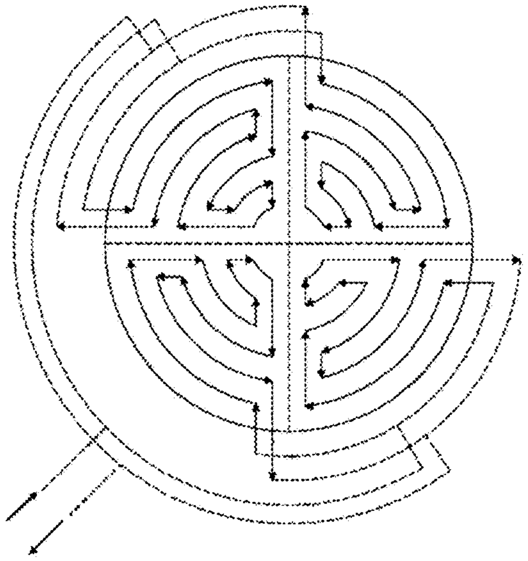

In some embodiments, ESC 200 includes cooling channels, e.g., cooling channel 220, embedded within ceramic body 202. FIGS. 9A-9F show example cross-sectional schematic views of cooling channels. Cooling channels can generate additional localized cooling which may (i) overcome limitations of the bonding material used to bond together ceramic puck with a cooling sub-assembly (e.g., composed of a different material), and (ii) improve cooling at a boundary with the top surface of the ESC to provide more thermal control. Cooling channels may form complex internal structures within the ceramic body, e.g., to provide uniform and localized cooling within the ceramic body. Internal structures of the cooling channels can be selected to maximize contact of the coolant with a surface area of the internal structure of the cooling channels. Additionally, cooling channels may define cooling paths (e.g., coolant flow paths) within the ceramic body of the ESC to provide localized cooling across the backside of a substrate when the substrate is retained by the ESC. Cooling channels can be located within the ceramic body of the ESC, e.g., below heating electrodes 222, 224 of the ESC. FIGS. 11A-11C show various example plan-view schematic views of cooling channels. Cooling channels can include one or more defined pathways for coolant flow. For example, cooling channels can include an inner flow path and an outer flow path as depicted in FIG. 11B. In another example, cooling channels can include two or more flow paths, e.g., quadrant flow paths, as depicted in FIG. 11A. Coolant paths for the cooling channels can be selected to accommodate one or more other internal structures of the ESC, e.g., lift pins, electrical feedthroughs, gas conduits, or the like. At times, an internal structure of the cooling channels and/or the cooling paths defined by the cooling channels embedded within the ceramic body may only be possible using additive manufacturing techniques (e.g., may not be cost-effective, accessible using subtractive or other traditional manufacturing techniques).

ESC 200 includes one or more heater electrodes, e.g., heater electrode 222, within the ceramic body for generating localized heating. The one or more electrodes can include, for example, multiple zone heaters, where each of the multiple zone heaters is operable to heating a portion of the ESC. For example, the multiple zone heaters can include two, three, or four zone heaters. In another example, the multiple zone heaters can be micro-zone (e.g., pixel) heaters, where the ESC can include about 20, 40, 50 100, 150, 200, or more micro-zone heaters each operable to heat a portion of the ESC.

As depicted in FIG. 2A, the ESC can include multiple heating zones (e.g., by multiple heating electrodes) 222, 224 that can generate a secondary temperature adjustment during the fabrication process, where the heating zones can locally (and independently) adjust temperature of the substrate in the heating zones during the fabrication process. The multiple heating zones (e.g., four heating zones) can be located within the ceramic body and further spaced apart from the top surface of the ceramic body of the ESC. As such, the respective effects by the multiple heating zones can be (at times) less than the effects of the gas-pressurized cooling zones as described above.

In some embodiments, the ESC can include (e.g., further include) microzone heaters (not shown) that can generate a tertiary temperature adjustment during the fabrication process, where the microzone heaters can locally (and independently) adjust temperature of the substrate in the "pixel-like" zones of the microzone heaters during the fabrication process. The microzone heaters can be located within the ceramic body and further spaced apart from the top surface of the ceramic body of the ESC from the multiple heater zones. As such, the respective effects by the microzone heaters can be (at times) less than the effects of the multiple heating zones and the gas-pressurized cooling zones as described above.

In some embodiments, the ESC 200 can include (e.g., further include) an edge heating zone, e.g., edge heater electrode 226, for integrating additional control of temperature across the surface of the substrate retained by the ESC 200. At times, one or more of the heater electrodes, e.g., electrodes 222, 224, 226, can have dimensions (e.g., area/shape) that is different than another heater electrode. For example, edge heater electrode 226 can include an annular shape corresponding to the edge region 210 of the ESC 200.

ESC 200 includes chucking electrode(s), e.g., chucking electrode 230, embedded within the ceramic body 202 of the ESC 200. Chucking electrode can include a direct current (DC) mesh. In some embodiments, the DC mesh can be composed of tungsten, molybdenum, or another metal material. In some embodiments, ESC 200 can include two or more chucking electrodes, e.g., a dual chucking mesh. The two or more chucking electrodes can have different or same shapes, densities of mesh, etc., which can be used to adjust a power/area (density) of the chucking force on a particular region of a substrate retained by the ESC 200. For example, different shapes of embedded mesh can be used to adjust an amount of force exerted by the respective chucking electrodes on the substrate. In some embodiments, the ESC can include an additional edge chucking electrode 232 in an edge region 210 for active edge control. The DC mesh of the edge chucking electrode in the edge region 210 can be embedded within the ceramic body, e.g., using additive manufacturing techniques.

Figure 2D:
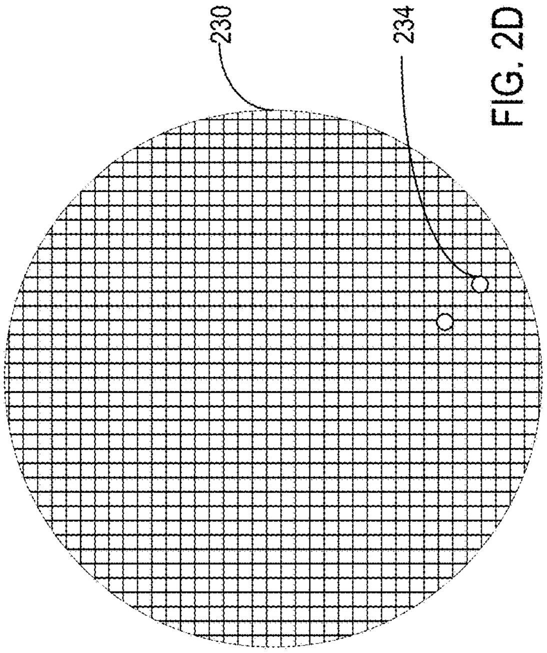

The chucking electrode 230 can include through holes, e.g., through hole 234 as depicted in FIG. 2D, to allow components to pass through the chucking electrode without contacting the chucking electrode. For example, to allow gas conduits to pass through the chucking electrode 230. In another example, to allow lift pins to pass through the chucking electrode 230.

The ESC 200 includes terminal leads 228, e.g., DC and/or AC leads. A portion of the terminal leads 228 can be embedded within the ceramic body 202 of the ESC 200 (e.g., feedthroughs) and to respective electrodes, sensors, etc. For example, terminal leads 228 can be in electrical contact with respective heater electrodes 222, 224, 226, sensors 214*a*, 214*b*, and chucking electrodes 230, 232. Terminal leads 228 can pass through a base of the ceramic body 202 of the ESC, e.g., as depicted in a plan-view of a bottom surface of the ESC 200 in FIG. 2C. Terminal leads 228 can be fed through the base of the ceramic body from a sub-component of the ESC, e.g., a cooling base 129 as described in FIG. 1, through a portion of the ceramic body 202 and to a point within the ceramic body (e.g., to provide voltage/current to an electrode) or to a top surface 201 of the ceramic body (e.g., to readout a sensor).

The ESC 200 includes lift pin holes, e.g., lift pin hole 233 as depicted in FIG. 2B, through which lift pins can pass through the ceramic body 202 and contact a backside of the substrate. The lift pin holes can have a diameter sufficiently large to allow free passage by the lift pin through the holes. The lift pins can be configured to contact a backside of the substrate and lift the substrate to a second position away from the ESC 200.

In some embodiments, a controller (e.g., controller 165) of a fabrication tool can execute a recipe including instructions for a fabrication process. The recipe can include temperature-control instructions executable by the controller 165 to control operations of various temperature-related components of the fabrication tool. For example, the temperature-related components can include (A) gas pressures introduced into each of the cooling regions of the ESC, (B) temperature settings for each of the multiple heaters with respective heating zones within the ceramic body of the ESC, (C) temperature settings for each of the microzone heaters within the ceramic body of the ESC, (D) coolant flow into cooling channels located in a base of the substrate support, or (E) any combination thereof. The recipe instructions can additionally include executable instructions related to other process parameters in addition to the operations of the ESC to operate components of the fabrication tool to control, for example, plasma power, flow of the etch gas, etc.

In some embodiments, additive manufacturing e.g., three-dimensional printing (or 3-D printing), may be used to produce (or make) the electrostatic chuck (ESC) described herein. In one embodiment, a computer (CAD) model of the required part is first made and then a slicing algorithm maps the information for every layer. A layer starts off with a thin distribution of powder spread over the surface of a powder bed. A chosen binder material then selectively joins particles where the object is to be formed. Then a piston which supports the powder bed and the part-in-progress is lowered in order for the next powder layer to be formed. After each layer, the same process is repeated followed by a final heat treatment to make the object. Since 3-D printing can exercise local control over the material composition, microstructure, and surface texture, various (and previously inaccessible) geometries may be achieved with this method.

Figure 5:
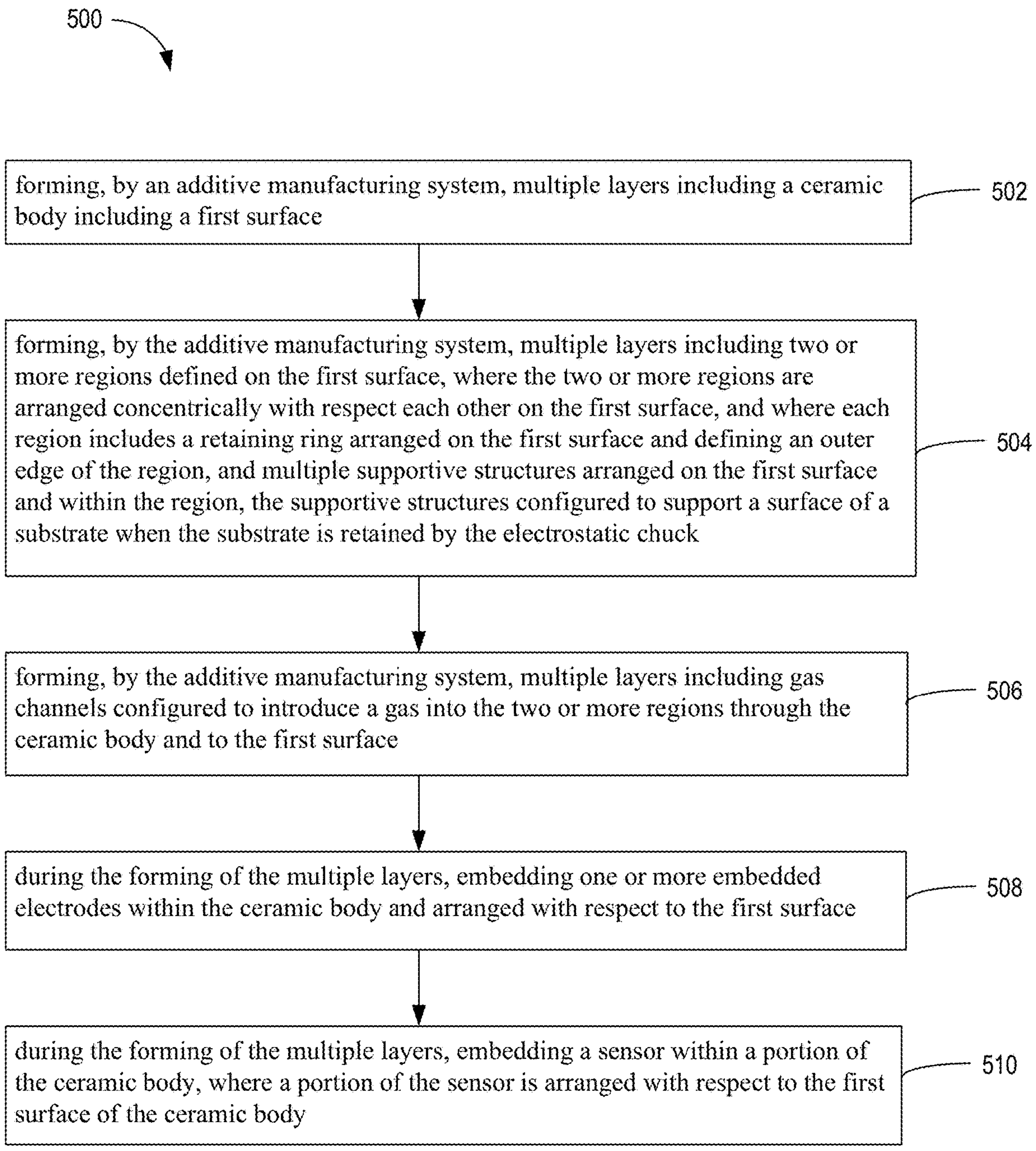
FIG. 5 is a flow diagram of an example process for manufacturing an electrostatic chuck.

In one embodiment, an ESC as described herein may be represented in a data structure readable by a computer rendering device or a computer display device. FIG. 5 is a schematic representation of a computer system with a computer-readable medium according to one embodiment. The computer-readable medium may contain a data structure that represents the ESC. The data structure may be a computer file, and may contain information about the structures, materials, textures, physical properties, or other characteristics of one or more articles. The data structure may also contain code, such as computer executable code or device control code that engages selected functionality of a computer rendering device or a computer display device. The data structure may be stored on the computer-readable medium. The computer readable medium may include a physical storage medium such as a magnetic memory, floppy disk, or any convenient physical storage medium. The physical storage medium may be readable by the computer system to render the article represented by the data structure on a computer screen or a physical rendering device which may be an additive manufacturing device, such as a 3D printer.

In some embodiments, additive manufacturing techniques can be used in combination with other manufacturing techniques, e.g., subtractive manufacturing. For example, subtractive manufacturing can be used to modify/remove portions of the ESC and additive manufacturing can be used to add/modify portions of the ESC. The combination of techniques can be used during the initial process to manufacture the ESC or to modify/refurbish/regrow an existing ESC to repair damage or change a configuration of the ESC features.

In some embodiments, additive manufacturing techniques can be used to regrow/refurbish portions of an ESC, e.g., to repair operational damage or manufacturing damage. For example, additive manufacturing techniques can be used to regrow/refurbish supportive structures (e.g., mesas) of an ESC. In another example, additive manufacturing techniques can be used to regrow/refurbish retaining rings. In some embodiments, additive manufacturing techniques can be used to modify/adapt portions of an ESC, to add features. Features can be added using additive manufacturing techniques to compensate for non-uniform etch process measured across a substrate during a fabrication process in a fabrication tool including the ESC. For example, supportive structures can be added or modified to compensate for non-uniform temperature control during the fabrication process.

In some embodiments, additive manufacturing techniques can be used to form the ESC and/or components of the processing chamber using two or more material compositions, e.g., simultaneously or sequentially. Different material compositions can include, for example, AlN and Al2O3. Different material compositions can include, for example, different porosity or another material structural difference of a same material composition. For example, the gas conduits can include porous plugs to pass helium to a top surface of the ESC, where the porous plugs are formed of a different material composition (or having a different material structure of a same material composition) than the ceramic body of the ESC. Different materials can include, for example, ceramic materials and metallic materials, e.g., AlN and Aluminum.

In some embodiments, additive manufacturing techniques can include ceramic-based additive manufacturing including a binder, e.g., a polymer binder, to form a slurry including a ceramic powder and where a photosensitizer can be included in the slurry that is sensitized (e.g., is curable by) to a wavelength of light. For example, a photopolymerization technique using ultraviolet (UV) light can be used to form a ceramic green body, which can then be consolidated into a ceramic part from the green body using a sintering process.

In some embodiments, additive manufacturing techniques can include coating process, where layers of a body are formed in a layer-by-layer process using coating techniques, e.g., plasma spray coating, screen printing, etc. Plasma spray coating process can be used to coat an exposed surface from a powder, e.g., a ceramic powder, metal powder, or a combination of ceramic and metallic powder. Screen printing can be used to form, for example, metal-based electrodes as described in this specification.

In some embodiments a sintering (e.g., firing) process can be used to consolidate the ceramic powder/particles (e.g., remove porosity and densify the ceramic material) of a green state ceramic part. For example, a sintering process can be performed at a high temperature below a melting point of the ceramic material(s) where the material of the separate particles diffuse towards neighboring power particles to form a densify ceramic body. In some embodiments, the sintering process includes a pre-heat process to remove organic materials, e.g., polymer(s), lubricant, binders, etc. In some embodiments, the sintering process includes a cooling process to cool down the ceramic parts to reduce cracking/stress formation.

In some embodiments, a rapid sintering process, e.g., a flash sintering process, can be performed on set of green ceramic layers of a green ceramic body. For example, a sintering process can be alternated with a forming/AM process, where a set number of layers and/or a combined thickness of a set of layers are formed by AM and then sintered in sequence before another set of layers are formed by AM on the exposed surface of the body. In other words, portions of the ceramic body are formed in a green state and sintered in succession, where an end result of the process is a densified ceramic body. For example, a flash sintering process can be used to sinter a layer(s) of green ceramic body between about 0.025 millimeters to about 0.8 millimeters.

In some embodiments, a refurbished part, e.g., an ESC where at least a portion of the ESC is regrown by additive manufacturing, can be sintered such that the regrown layers of the refurbishing process are densified, e.g., to match characteristics of the original ESC.

FIG. 5 is a flow diagram of an example process 500 for manufacturing an electrostatic chuck for substrate processing. For convenience, the process 500 will be described with respect to an additive manufacturing system that performs at least some steps of the process.

An additive manufacturing system forms multiple layers including a ceramic body having a first surface (502). The additive manufacturing system can receive, from a computer system, a data structure representative of the ESC, and use the data structure to form the multiple layers of the ESC.

The additive manufacturing system forms multiple layers including two or more regions defined on the first surface, where the two or more regions are arranged concentrically with respect to each other on the first surface, and where each region includes a retaining ring arranged on the first surface and defining an outer edge of the region, and multiple supportive structures arranged on the first surface and within the region, the supportive structures configured to support a surface of a substrate when the substrate is retained by the electrostatic chuck (504).

The additive manufacturing system forms multiple layers including gas conduits configured to introduce a gas into the two or more regions through the ceramic body and to the first surface (506). Each of the gas conduits can include a respective porous plug, where the porous plug can be made of a different material composition (e.g., a different ceramic) and/or having different structural characteristics than the ceramic body (e.g., a different porosity, internal structure). The forming of the layers including the porous plug can include additive manufacturing techniques including forming the layer include two different material compositions simultaneously or sequentially.

During the formation of the multiple layers by the additive manufacturing system, embedding one or more embedded electrodes within the ceramic body and arranged with respect to the first surface (508). Embedding the one or more embedded electrodes can be performed by a human operator or an automated system (e.g., a robotic arm, a metals-based additive manufacturing system). Embedding the one or more embedded electrodes can include delaying (e.g., pausing) the formation of the multiple layers by the additive manufacturing system, inserting the one or more embedded electrodes, and restarting the formation of multiple layers over/around the embedded electrodes.

During the formation of the multiple layers by the additive manufacturing system, embedding a sensor within a portion of the ceramic body, where a portion of the sensor is arranged with respect to the first surface of the ceramic body (510). Embedding the sensor can be performed by a human operator or an automated system (e.g., a robotic arm, a metals-based additive manufacturing system). Embedding the sensor can include delaying (e.g., pausing) the formation of the multiple layers by the additive manufacturing system, inserting the sensor, and restarting the formation of multiple layers over/around the sensor. In one example, a portion of the sensor can be a printed circuit, where a metals-based additive manufacturing system can be used to print the printed circuit of the sensor onto the formed layers of the ESC.

In some embodiments, a ceramic body of the ESC can be directly formed onto a surface of the cooling base, e.g., cooling base 129, using various additive manufacturing techniques and can be performed without an intermediary, bonding layer. A material composition of the ESC can be different than a material composition of the cooling base. For example, the ESC can be composed of a ceramic material, e.g., AlN or Al2O3, and the cooling base can be composed of a metal, e.g., aluminum or an aluminum alloy. For example, the ceramic-based ESC can be formed on the metal cooling base without an elastomer/adhesive layer between the ceramic and metal layers. For example, the ceramic-based ESC can be formed on the metal cooling base without a metal bonding layer between the ceramic body of the ESC and metal cooling base.

Figure 8:
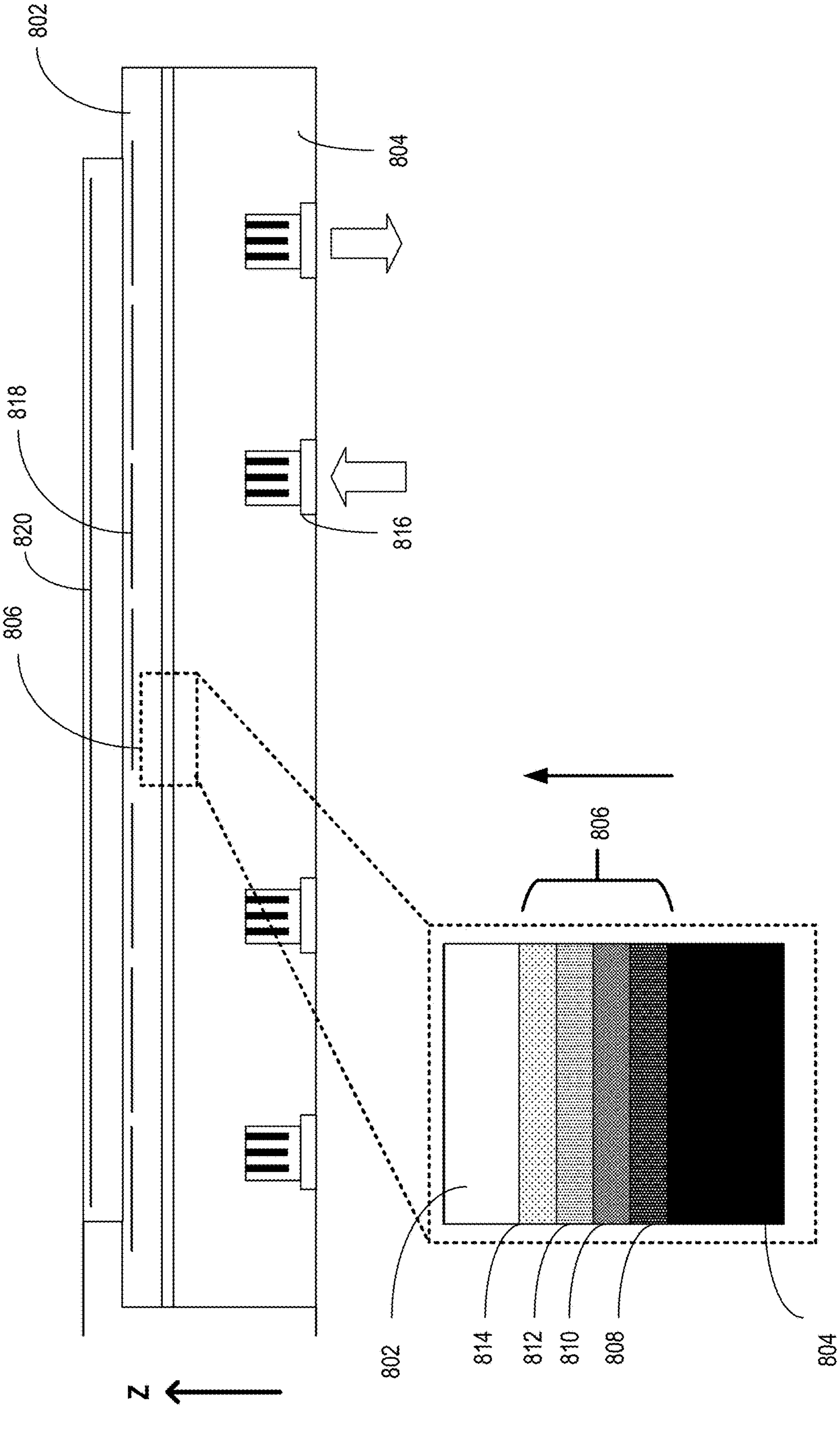
FIG. 8 an example schematic view of portions of an electrostatic chuck and cooling base for substrate processing.

In some embodiments, the ceramic body of the ESC can be formed on the cooling base using a set of transitional layers including a composition gradient between the respective compositions of the cooling base and the ESC. FIG. 8 an example schematic view of a portion of an ESC 802 and cooling base 804 for substrate processing. ESC 802 is supported by the cooling base 804, where a transitional zone 806 is located between the ESC 802 and the cooling base 804. As described above, the transitional zone 806 includes multiple transitional sub-zones, e.g., sub-zones 808, 810, 812, and 814. Each sub-zone can include one or more layers formed using additive manufacturing techniques. The cooling base 804, transitional zone 806, and ESC 802 are formed as a monolithic structure, where the ESC 802 is attached to the cooling base 804 by the transitional zone 806. In other words, such that no additional bonding layer is used to attach the ESC 802 and the cooling base 804. Cooling base 804 includes coolant channels, e.g., coolant channel 816, to facilitate flow of coolant in and out of the cooling base 804.

In some embodiments, transitional zone 806 includes a gradient of composition between a first sub-zone (including one or more layers) adjacent to the cooling base and a final sub-zone (including one or more layers) adjacent to the ESC. The gradient of composition can include a ratio of composition between composition A and composition B. In some embodiments, composition A includes a composition of materials of the cooling base and composition B includes a composition of materials of the ESC. For example, the gradient of composition can include a ratio of composition A and composition B between aluminum and AlN or Al2O3. Each sub-zone of the transitional zone 806 can include a different ratio of composition A to composition B. Although depicted in FIG. 8 as a transitional zone 806 including four sub-zones 808, 810, 812, and 814, more or fewer transitional sub-zones can be included in the transitional zone 806.

In some embodiments, the sub-zones of the transitional zone 806 include a gradient of compositions, each sub-zone having a different ratio of composition A to composition B to the sub-zone adjacent to it. For example, a first sub-zone, e.g., sub-zone 808, located adjacent to the cooling base 804 includes a material composition that is aligned with (e.g., matching or having a larger fraction of) the material composition of the cooling base 804 and a fourth sub-zone, e.g., sub-zone 814, located adjacent to the ESC 802 includes a material composition that is aligned with (e.g., having a larger fraction of) the material composition of the ESC 802. Table 1 includes an example composition gradient for the transitional zone 806 including five sub-zones, e.g., layers 1-5.

TABLE 1

| Layer | Composition A | Composition B |
|---|---|---|
| ESC | 100 | 0 |
| 1 | 80 | 20 |
| 2 | 60 | 40 |
| 3 | 50 | 50 |
| 4 | 40 | 60 |
| 5 | 20 | 80 |
| Cooling Base | 0 | 100 |

Each transitional sub-zone has a respective coefficient of thermal expansion (CTE), where the CTE depends in part on the composition of the layer, e.g., the ratio of composition A to composition B. For example, as the composition shifts toward more ceramic and less metal, the CTE of the sub-zone of the transitional zone will approach the CTE of the ceramic body of the ESC 802.

In some embodiments, a final transitional sub-zone (e.g., 814) of the transitional zone 806 can be different composition from the ceramic body composition of the ESC 802, e.g., can still include a percentage of the composition of the cooling base. The composition of the transitional sub-zone 814 adjacent to the ESC 802 can be selected to have a CTE that is within a threshold deviation of the CTE of the ceramic body of the ESC 802. The CTE of the composition can be calculated using equation (1) as a linear relationship between the respective CTE of the composite materials and the ratios thereof.

$$CTE_{composite} = CTE_A\,(X) + CTE_B\,(1 - X) \tag{1}$$

where $CTE_A$ is the CTE of material A (e.g., Aluminum) of the composition and $CTE_B$ is the CTE of material B of the composition (e.g., AlN), and X represents a percentage of material A in the composition of the transitional sub-zone. For example, the transitional sub-zone 814 can have a CTE that is about <10%, <5%, <2%, or less of a deviation from the CTE of the ceramic body of the ESC 802. In another example, the CTE of the sub-zone 814 has a CTE that is selected to be about <2× of the CTE of the ceramic body of the ESC 802.

In some embodiments, a composition of the transitional sub-zone 814 adjacent to the ESC 802 can be selected to have a CTE that is within a tolerance threshold of a CTE of the ESC 802 and that meets a minimum structural stability threshold, e.g., a ceramic solid's loading of about 55-70% in a metallic matrix. For example, the composition of ceramic powder within a metal matrix can be selected such that contact between ceramic particulates of the ceramic powder is limited within the metal matrix. In another example, a composition of ceramic powder within a metal matrix can be selected based in part on a volume ratio of ceramic powder within the metal matrix.

In some embodiments, a composition of the transitional sub-zone 814 adjacent to the ESC 802 can be selected based in part on a temperature of depositing the layers can be selected based in part on a range of operating temperatures of the ESC within the processing chamber. The composition of the transitional sub-zone 814 can be selected such that stresses induced in the layer due to heating of the ESC during operation are below a threshold stress. For example, the composition of the transitional sub-zone 814 can be selected such that during operation, the deposited layers of the sub-zone are at a near zero stress state. Operating temperatures of the ESC can include, for example, 90-120 degrees C.

In some embodiments, transitional zone 806 can be formed using additive manufacturing techniques. In one example, additive manufacturing techniques include spray coating, e.g., plasma spray coating. Spray coating can be used to form multiple layers of the transitional zone, each layer having a thickness between about 10-30 microns along a z-direction. A dispense ratio of composition A and composition B, e.g., a ceramic powder and a metallic powder, can be adjusted to adjust a composition of each of the sub-zones of the transitional zone 806. The additive manufacturing techniques can be used to form layers including a metallic matrix with distributed ceramic particles within the metallic matrix. In some embodiments, a layer includes ceramic particles that have at least a threshold randomness of dispersion within the metallic matrix, where a CTE of the layer is related to a volumetric ratio of the ceramic powder versus the metallic matrix. In some embodiments, a porosity of the gradient layers of the transitional zone 806 can be varied in addition to or instead of the variation of the material composition of the layers.

In some embodiments, a surface of the cooling base 804 can be pre-processed prior to forming the layers of the transitional zone 806 on the exposed surface of the cooling base. Pre-processing can include, for example, surface roughening, texturing, etc. Roughening of the surface can be, for example, about 1-5 microns RMS roughness of the surface.

In some embodiments, after formation of transitional zone 806, a ceramic body can be formed in a layer-by-layer process to form the ESC 802. In one example, the ceramic body can be formed in a green state using a binder and photopolymerization with periodic flash sintering, where techniques can include periodically using a flash sintering process to densify a set of green state layers of the ceramic body, during the forming of the ESC 802. In another example, the ceramic body can be formed using a direct sintering of ceramic powder.

Figure 10:
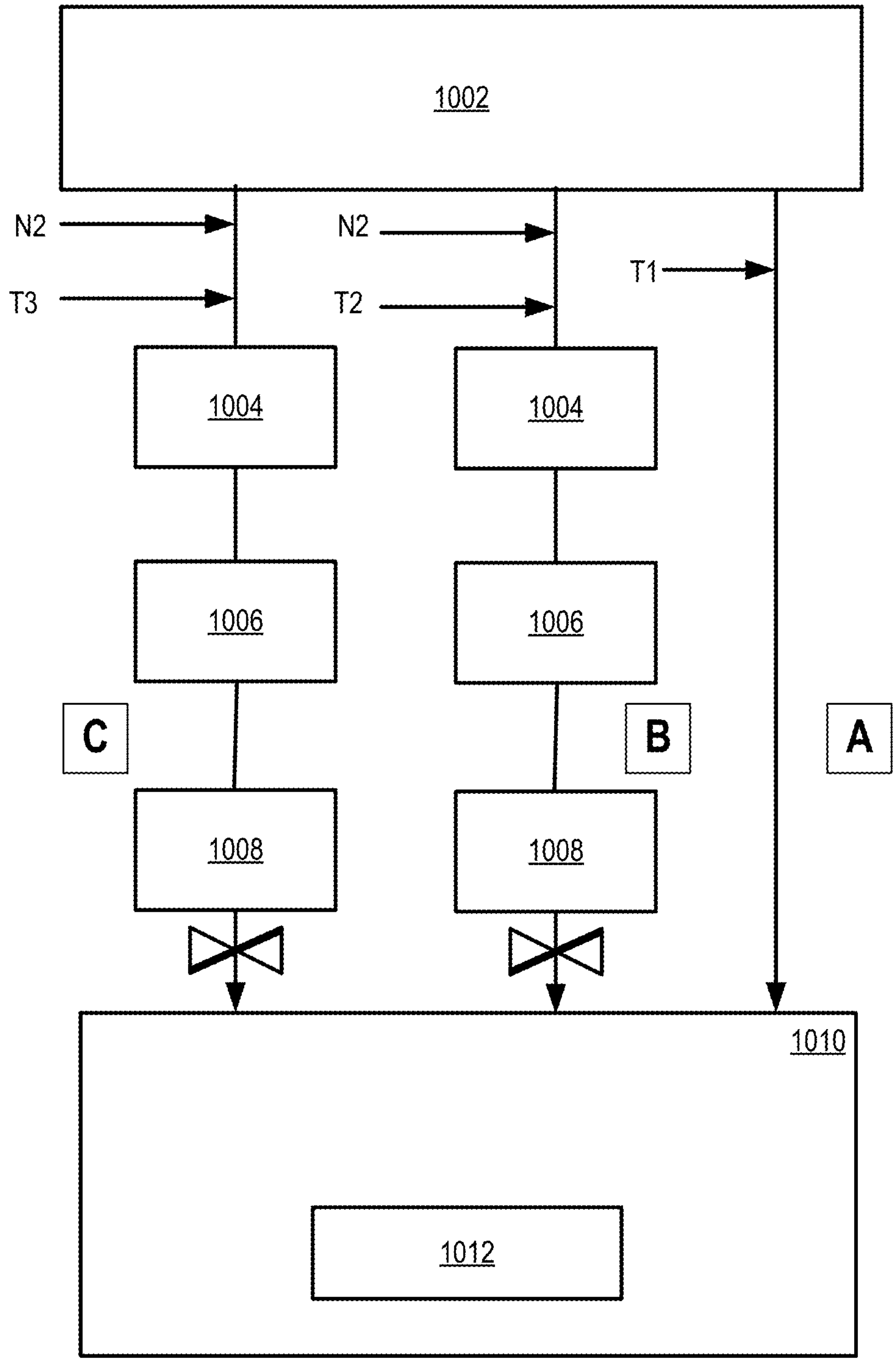
FIG. 10 shows an example schematic view of an additive manufacturing system for fabricating portions of an electrostatic chuck for substrate processing.

In some embodiments, one or more layers of the ESC, cooling base, and/or transitional zone can be formed from respective powder compositions using an additive manufacturing system. The additive manufacturing system includes a dispensing subsystem for dispensing starting material, e.g., powder or slurry, and an energy source, e.g., a laser, LED(s), UV light source, etc., for curing or fusing the starting material. The additive manufacturing system can further include a sintering subsystem, e.g., flash sintering subsystem, for sintering one or more layers of the green-state ceramic body. FIG. 10 shows an example schematic view of an additive manufacturing system 1000 for fabricating portions of an electrostatic chuck for substrate processing. Starting materials for use in forming the multiple layers of the ESC, cooling base, and/or transitional zone can be prepared from a starting material 1002, e.g., aluminum powder. The system 1000 can react the starting material 1002, e.g., using respective temperatures T1, T2, and T3 of applied heat and/or gas source N2, to generate an exothermic reaction to yield other starting materials. For example, a direct nitride process can apply heat and nitrogen gas to aluminum powder to yield aluminum nitride (AlN) by an exothermic reaction:

$$2Al\left(\frac{s}{l}\right)+N2(g)\rightarrow 2AlN(s)+\text{heat.}$$

In another example, a metal matrix composite can be formed, e.g., AlN shell with an Al core particles, or partially fused Al/AlN particles. The resulting generated starting materials 1004 can be further processed, e.g., ground into a powder distribution 1006, and retained 1008 to be provided to the processing chamber 1010 for use in the additive manufacturing process to form a part 1012. An aluminum powder can be provided (A) to form aluminum layers, e.g., of the cooling base and/or transitional zone. A metal matrix composite powder can be provided (B) to form layers of the transitional zone. An AlN ceramic powder can be provided (C) to form ceramic layers, e.g., of the ESC or transitional zone. The provided materials of (A), (B), and (C) can be used to form one or more layers of the part 1012 using additive manufacturing processes, as described herein. In some embodiments, any of materials of (A), (B), and (C) can be combined in selected ratios to form layers in the additive manufacturing process. The selected ratios can be adjusted using respective valves.

In some embodiments, during the formation of the ceramic body of the ESC 802, additional features of the ESC can be formed, e.g., using additive manufacturing techniques (as described above). For example, heaters (e.g., heater 818) and chucking electrodes (e.g., chucking electrode 820) can be formed within the ceramic body using screen printing techniques.

In some embodiments, additive manufacturing techniques can be used to refurbish and/or modify an ESC. For example, an additive manufacturing system can be used to add one or more layers of ceramic of the ESC. The one or more layers can include one or more locally formed layers, e.g., layers to reform a portion of the ESC. An additive manufacturing system can be used to refurbish an ESC that may have wear or degradation of at least a portion of the ESC, e.g., due to fabrication processes, etch chemistries, plasma, etc. For example, the additive manufacturing system can be used to regrow a portion of one or more supportive structures (e.g., mesas) of the ESC. In another example, the additive manufacturing system can be used to regrow a portion of a gas conduit, e.g., a porous plug. In another example, the additive manufacturing system can be used to regrow a portion of the retaining rings.

Figure 6:
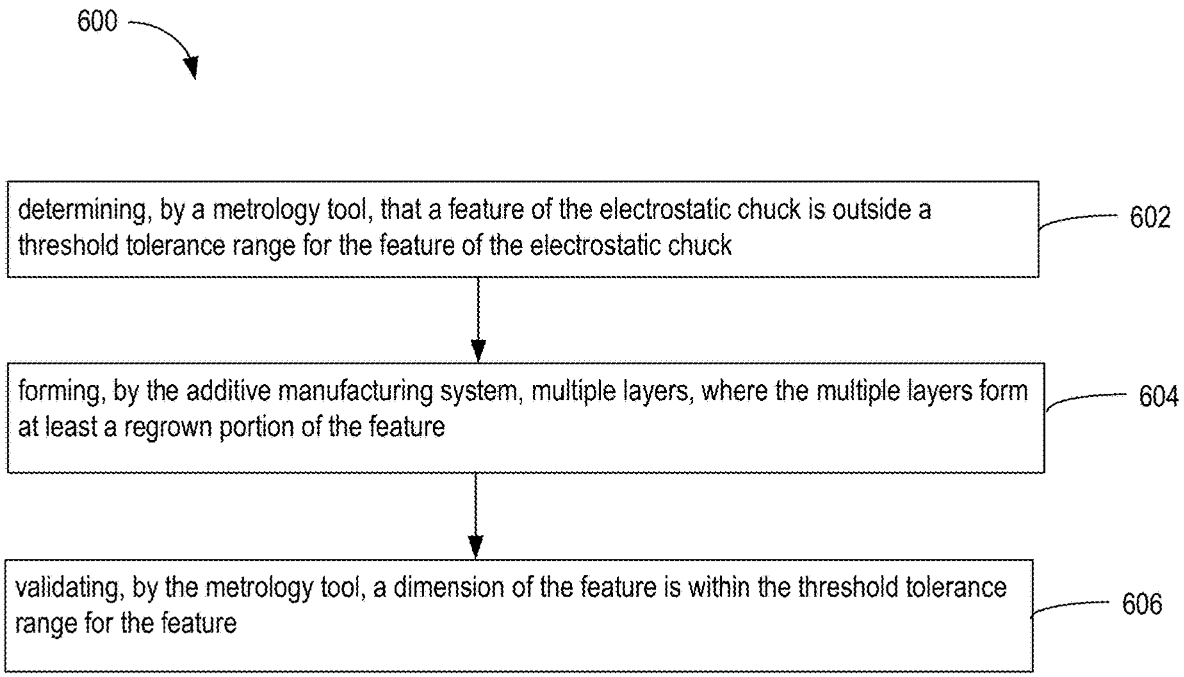
FIG. 6 is a flow diagram of an example process for re-growth of an electrostatic chuck.

FIG. 6 is a flow diagram of an example process 600 for regrowth of an electrostatic chuck for substrate processing. For convenience, the process 600 will be described with respect to an additive manufacturing system that performs at least some steps of the process. In some embodiments, a refurbishment process can include, determining, using a metrology tool, that a feature of an ESC is out of a threshold tolerance range for the feature of the ESC (602). For example, a three-dimensional mapping/scanning system can be used to generate a three-dimensional map of an ESC. For example, a mesa can be degraded such that a dimension of the mesa (e.g., a height) is outside a threshold range of height for the mesa. Determining that a feature of the ESC is out of a threshold range of tolerances can include, for example, comparing the three-dimensional map of the ESC to a computer-generated model (e.g., a CAD model) of the ESC. In some embodiments, a computer system can receive the three-dimensional mapping and the comparison to the computer-generated model, and identify one or more features that require refurbishment. The computer system can generate instructions including forming of one or more layers to add to the one or more features.

In some embodiments, the methods include a pre-processing step of preparing a surface of the ESC prior to a regrowth process. For example, a pre-processing step can include surface preparation (e.g., texturing, scoring, cleaning, etc.) of the surface where one or more layers will be formed by additive manufacturing. In another example, a pre-processing step can include preparing a planar surface, e.g., planarizing the surface on which at least one of the multiple layers will be formed.

In some embodiments, a pre-processing step can include removing at least a portion of the feature that is determined to be outside a threshold tolerance range. For example, a pre-processing step can include removing multiple features from a top surface of the ceramic body, e.g., both features determined to be within a threshold range of tolerance and features determined to be outside a threshold range of tolerance. In another example, the pre-processing step can include removing retaining rings and supportive structures (e.g., mesas) from the top surface of the ceramic body.

In some embodiments, an additive manufacturing system can receive the ESC and the instructions for forming the one or more layers, wherein the layers form at least a regrown portion of the feature by an additive manufacturing process (604). For example, the additive manufacturing system can form one or more layers onto the identified one or more features such that the dimensions of the one or more features are within the threshold range of tolerances for the respective features.

In some embodiments, metrology tools can be used to validate the refurbished ESC, including validating that dimensions of one or more features of the ESC are within the threshold tolerance range for the respective features (606). For example, validation can include capturing another three-dimensional map of the ESC and compare the map to the computer-generated model for the part.

Figure 7:
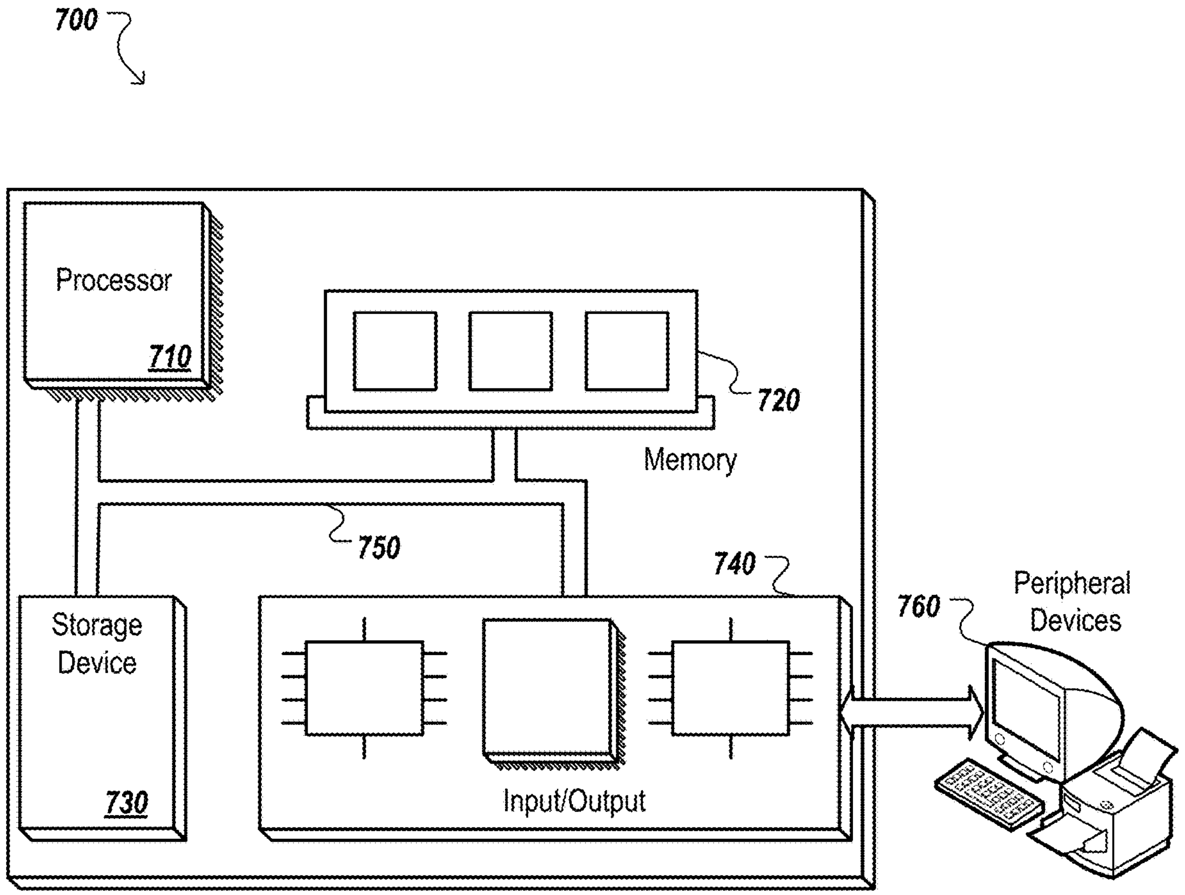
FIG. 7 shows an example generic computer system.

FIG. 7 is block diagram of an example computer system 700 that can be used to perform operations described above. For example, such as operations performed by the electrostatic chuck model. The system 700 includes a processor 710, a memory 720, a storage device 730, and an input/output device 740. Each of the components 710, 720, 730, and 740 can be interconnected, for example, using a system bus 750. The processor 710 is capable of processing instructions for execution within the system 700. In one implementation, the processor 710 is a single-threaded processor. In another implementation, the processor 710 is a multi-threaded processor. The processor 710 is capable of processing instructions stored in the memory 720 or on the storage device 730.

The memory 720 stores information within the system 700. In one implementation, the memory 720 is a computer-readable medium. In one implementation, the memory 720 is a volatile memory unit. In another implementation, the memory 720 is a non-volatile memory unit.

The storage device 730 is capable of providing mass storage for the system 700. In one implementation, the storage device 730 is a computer-readable medium. In various different implementations, the storage device 730 can include, for example, a hard disk device, an optical disk device, a storage device that is shared over a network by multiple computing devices (e.g., a cloud storage device), or some other large capacity storage device.

The input/output device 740 provides input/output operations for the system 700. In one implementation, the input/output device 740 can include one or more of a network interface device, e.g., an Ethernet card, a serial communication device, e.g., and RS-232 port, and/or a wireless interface device, e.g., and 802.11 card. In another implementation, the input/output device can include driver devices configured to receive input data and send output data to peripheral devices 760, e.g., keyboard, printer and display devices. Other implementations, however, can also be used, such as mobile computing devices, mobile communication devices, set-top box television client devices, etc.

Although an example processing system has been described in FIG. 7, implementations of the subject matter and the functional operations described in this specification can be implemented in other types of digital electronic circuitry, or in computer software, firmware, or hardware, including the structures disclosed in this specification and their structural equivalents, or in combinations of one or more of them.

Aspects of the subject matter and the actions and operations described in this specification, for example, computing devices such as controller 165 and processes performed by controller 165 such as controlling switching of etching gasses of a plasma processing chamber, can be implemented in digital electronic circuitry, in tangibly-embodied computer software or firmware, in computer hardware, including the structures disclosed in this specification and their structural equivalents, or in combinations of one or more of them. The subject matter and the actions and operations described in this specification can be implemented as or in one or more computer programs, e.g., one or more modules of computer program instructions, encoded on a computer program carrier, for execution by, or to control the operation of, data processing apparatus. The carrier can be a tangible non-transitory computer storage medium. Alternatively, or in addition, the carrier can be an artificially-generated propagated signal, e.g., a machine-generated electrical, optical, or electromagnetic signal, which is generated to encode information for transmission to suitable receiver apparatus for execution by a data processing apparatus. The computer storage medium can be or be part of a machine-readable storage device, a machine-readable storage substrate, a random or serial access memory device, or a combination of one or more of them. A computer storage medium is not a propagated signal.

The term "data processing apparatus" encompasses all kinds of apparatus, devices, and machines for processing data, including by way of example a programmable processor, a computer, or multiple processors or computers. Data processing apparatus can include special-purpose logic circuitry, e.g., an FPGA (field programmable gate array), an ASIC (application-specific integrated circuit), or a GPU (graphics processing unit). The apparatus can also include, in addition to hardware, code that creates an execution environment for computer programs, e.g., code that constitutes processor firmware, a protocol stack, a database management system, an operating system, or a combination of one or more of them.

A computer program can be written in any form of programming language, including compiled or interpreted languages, or declarative or procedural languages; and it can be deployed in any form, including as a stand-alone program, e.g., as an app, or as a module, component, engine, subroutine, or other unit suitable for executing in a computing environment, which environment can include one or more computers interconnected by a data communication network in one or more locations.

A computer program can, but need not, correspond to a file in a file system. A computer program can be stored in a portion of a file that holds other programs or data, e.g., one or more scripts stored in a markup language document, in a single file dedicated to the program in question, or in multiple coordinated files, e.g., files that store one or more modules, sub-programs, or portions of code.

The processes and logic flows described in this specification can be performed by one or more computers executing one or more computer programs to perform operations by operating on input data and generating output. The processes and logic flows can also be performed by special-purpose logic circuitry, e.g., an FPGA, an ASIC, or a GPU, or by a combination of special-purpose logic circuitry and one or more programmed computers.

Computers suitable for the execution of a computer program can be based on general or special-purpose microprocessors or both, and any other kind of central processing unit. Generally, a central processing unit will receive instructions and data from a read-only memory or a random-access memory or both. The essential elements of a computer are a central processing unit for executing instructions and one or more memory devices for storing instructions and data. The central processing unit and the memory can be supplemented by, or incorporated in, special-purpose logic circuitry.

Generally, a computer will also include, or be operatively coupled to, one or more mass storage devices, and be configured to receive data from or transfer data to the mass storage devices. The mass storage devices can be, for example, magnetic, magneto-optical, or optical disks, or solid-state drives. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

To provide for interaction with a user, the subject matter described in this specification can be implemented on one or more computers having, or configured to communicate with, a display device, e.g., a LCD (liquid crystal display) monitor, or a virtual-reality (VR) or augmented-reality (AR) display, for displaying information to the user, and an input device by which the user can provide input to the computer, e.g., a keyboard and a pointing device, e.g., a mouse, a trackball or touchpad. Other kinds of devices can be used to provide for interaction with a user as well; for example, feedback and responses provided to the user can be any form of sensory feedback, e.g., visual, auditory, speech or tactile; and input from the user can be received in any form, including acoustic, speech, or tactile input, including touch motion or gestures, or kinetic motion or gestures or orientation motion or gestures. In addition, a computer can interact with a user by sending documents to and receiving documents from a device that is used by the user; for example, by sending web pages to a web browser on a user's device in response to requests received from the web browser, or by interacting with an app running on a user device, e.g., a smartphone or electronic tablet. Also, a computer can interact with a user by sending text messages or other forms of message to a personal device, e.g., a smartphone that is running a messaging application, and receiving responsive messages from the user in return.

This specification uses the term “configured to” in connection with systems, apparatus, and computer program components. That a system of one or more computers is configured to perform particular operations or actions means that the system has installed on it software, firmware, hardware, or a combination of them that in operation cause the system to perform the operations or actions. That one or more computer programs is configured to perform particular operations or actions means that the one or more programs include instructions that, when executed by data processing apparatus, cause the apparatus to perform the operations or actions. That special-purpose logic circuitry is configured to perform particular operations or actions means that the circuitry has electronic logic that performs the operations or actions.

While this specification contains many specific implementation details, these should not be construed as limitations on the scope of what is being claimed, which is defined by the claims themselves, but rather as descriptions of features that can be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features can be described above as acting in certain combinations and even initially be claimed as such, one or more features from a claimed combination can in some cases be excised from the combination, and the claim can be directed to a subcombination or variation of a subcombination.

Similarly, while operations are depicted in the drawings and recited in the claims in a particular order, this by itself should not be understood as requiring that such operations be performed in the particular order shown or in sequential order, or that all illustrated operations be performed, to achieve desirable results. In certain circumstances, multitasking and parallel processing can be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing can be advantageous.

What is claimed is:

1. An electrostatic chuck (ESC) structure embodied in a machine-readable medium for designing, manufacturing, or testing a design, the ESC structure comprising:

a ceramic body comprising a first surface;

two or more regions defined on the first surface, wherein the two or more regions are arranged concentrically with respect to each other on the first surface, wherein each region comprises:

a retaining ring arranged on the first surface and defining an outer edge of the region; and a plurality of structures arranged on the first surface and within the region, the plurality of structures configured to support a surface of a substrate when the substrate is retained by the electrostatic chuck;

one or more gas conduits configured to introduce a gas into the two or more regions through the ceramic body and to the first surface, wherein the two or more regions are configured to retain a positive gas pressure within a respective region and the surface of a substrate when the substrate is retained by the electrostatic chuck;

one or more embedded electrodes within the ceramic body and arranged with respect to the first surface, wherein the one or more embedded electrodes are configured to generate a retaining force on the surface of the substrate when the substrate is retained by the ESC structure; and a transitional zone formed on a surface of a cooling base, the transitional zone comprising a plurality of layers including a gradient of material composition between the cooling base and the ceramic body.

2. The ESC structure embodied in the machine readable medium of claim 1, further comprising a sensor embedded within a portion of the ceramic body, where a portion of the sensor is arranged with respect to the first surface of the ceramic body, and where the sensor is configured to collect a measurement of the surface of the substrate when the substrate is retained by the electrostatic chuck.

3. The ESC structure embodied in the machine readable medium of claim 2, wherein the sensor comprises a thermocouple configured to measure a temperature of the first surface of the ceramic body or a temperature of the surface of the substrate.

4. The ESC structure embodied in the machine readable medium of claim 2, wherein the sensor comprises an embedded acoustic emission sensor.

5. The ESC structure embodied in the machine readable medium of claim 1, wherein the plurality of structures of at least one of the two or more regions comprises tapered mesas, and wherein the tapered mesas comprise a first cross-sectional diameter at a base of the tapered mesas contacting the first surface and a second, different cross-sectional diameter at a contact point of the tapered mesas with the surface of the substrate when the substrate is retained by the ESC structure.

6. The ESC structure embodied in the machine readable medium of claim 5, wherein the first cross-sectional diameter is larger than the second, different cross-sectional diameter.

7. The ESC structure embodied in the machine readable medium of claim 1, wherein the one or more embedded electrodes comprise a first electrode having a first shape arranged with respect to a central portion of the ceramic body, and a second electrode having a second, different shape arranged with respect to an outer portion of the ceramic body.

8. The ESC structure embodied in the machine readable medium of claim 7, wherein the second electrode is configured to generate a retaining force on an outer edge of the surface of the substrate.

9. The ESC structure embodied in the machine readable medium of claim 1, wherein the one or more embedded electrodes comprise two electrodes, wherein the two electrodes comprise mesh layers embedded within the ceramic body being different from each other in at least one of (i) a shape and (ii) a density of the mesh layers.

10. The ESC structure embodied in the machine readable medium of claim 1, further comprising cooling channels within a portion of the ceramic body and configured to facilitate a flow of coolant through a portion of the ceramic body.

11. The ESC structure embodied in the machine readable medium of claim 1, wherein the gas conduits further comprise a porous plug within at least one of the gas conduits, and wherein the ceramic body comprises a first material composition and, wherein porous plug comprises a second material composition.

12. The ESC structure embodied in the machine readable medium of claim 1, wherein the structure resides on storage medium as a data format used for an exchange of layout data.

13. The ESC structure embodied in the machine readable medium of claim 1, wherein the transitional zone comprises:

two or more transitional sub-zones, each transitional sub-zone comprising a different material composition, wherein each material composition of the transitional sub-zone comprises a ratio between a first material composition of the cooling base and a second material composition of the ceramic body.

14. The ESC structure embodied in the machine readable medium of claim 13, wherein each transitional sub-zone comprises a ceramic powder dispersed within a metallic matrix, wherein a volume of ceramic powder within the metallic matrix is different for each sub-zone of the two or more transitional sub-zones.

15. A method of manufacturing an electrostatic chuck (ESC) structure, the method comprising:

forming, by an additive manufacturing system, a plurality of layers, the plurality of layers comprising:

a ceramic body comprising a first surface;

two or more regions defined on the first surface, wherein the two or more regions are arranged concentrically with respect to each other on the first surface, and wherein each region comprises:

a retaining ring arranged on the first surface and defining an outer edge of the region; and a plurality of supportive structures arranged on the first surface and within the region, the plurality of supportive structures configured to support a surface of a substrate when the substrate is retained by the electrostatic chuck; and gas conduits configured to introduce a gas into the two or more regions through the ceramic body and to the first surface, wherein, during the forming of the plurality of layers, the method further comprises:

embedding one or more embedded electrodes within the ceramic body and arranged with respect to the first surface; and forming a transitional zone on a surface of a cooling base, the transitional zone comprising a plurality of layers including a gradient of material composition between the cooling base and the ceramic body, wherein forming the plurality of layers of the ceramic body comprises forming at least one layer on the transitional zone.

16. The method of claim 15, wherein, during the forming of the plurality of layers, the method further comprises embedding a sensor within a portion of the ceramic body, where a portion of the sensor is arranged with respect to the first surface of the ceramic body.

17. The method of claim 16, wherein forming the transitional zone comprises:

forming two or more transitional sub-zones, each transitional sub-zone comprising a different material composition, wherein each material composition of the transitional sub-zone comprises a ratio between a first material composition of the cooling base and a second material composition of the ceramic body.

18. The method of claim 17, wherein forming the transitional zone comprises:

forming the two or more transitional sub-zones, each transitional sub-zone comprising a ceramic powder dispersed within a metallic matrix, wherein a volume of ceramic powder within the metallic matrix is different for each sub-zone of the two or more transitional sub-zones.

19. The method of claim 18, wherein forming the transitional zone on the surface of the cooling base comprises forming the plurality of layers by spray coating.

20. The method of claim 16, wherein forming the plurality of layers comprises:

for each subset of layers of the plurality of layers forming, by the additive manufacturing system, the subset of layers of the plurality of layers; and densifying the subset of layers by flash sintering.

21. An electrostatic chuck (ESC) structure for substrate processing, the electrostatic chuck comprising:

a ceramic body comprising a first surface;

two or more regions defined on the first surface, wherein the two or more regions are arranged concentrically with respect to each other on the first surface, wherein each region comprises:

a retaining ring arranged on the first surface and defining an outer edge of the region; and a plurality of structures arranged on the first surface and within the region, the plurality of structures configured to support a surface of a substrate when the substrate is retained by the electrostatic chuck;

one or more gas conduits configured to introduce a gas into the two or more regions through the ceramic body and to the first surface, wherein the two or more regions are configured to retain a positive gas pressure within a respective region and the surface of a substrate when the substrate is retained by the electrostatic chuck;

one or more embedded electrodes within the ceramic body and arranged with respect to the first surface, wherein the one or more embedded electrodes are configured to generate a retaining force on the surface of the substrate when the substrate is retained by the ESC structure; and a transitional zone formed on a surface of a cooling base, the transitional zone comprising a plurality of layers including a gradient of material composition between the cooling base and the ceramic body.

22. The ESC structure of claim 21, further comprising a sensor embedded within a portion of the ceramic body, where a portion of the sensor is arranged with respect to the first surface of the ceramic body, and where the sensor is configured to collect a measurement of the surface of the substrate when the substrate is retained by the electrostatic chuck.

23. The ESC structure of claim 22, wherein the sensor comprises (A) a thermocouple configured to measure a temperature of the first surface of the ceramic body or a temperature of the surface of the substrate or an embedded acoustic emission sensor.

24. The ESC structure of claim 21, wherein the plurality of structures of at least one of the two or more regions comprises tapered mesas, and wherein the tapered mesas comprise a first cross-sectional diameter at a base of the tapered mesas contacting the first surface and a different second cross-sectional diameter at a contact point of the tapered mesas with the surface of the substrate when the substrate is retained by the ESC structure.

25. The ESC structure of claim 24, wherein the first cross-sectional diameter is larger than the second cross-sectional diameter.

26. The ESC structure of claim 21, wherein the one or more embedded electrodes comprise a first electrode having a first shape arranged with respect to a central portion of the ceramic body, and a second electrode having a second, different shape arranged with respect to an outer portion of the ceramic body.

27. The ESC structure of claim 26, wherein the second electrode is configured to generate a retaining force on an outer edge of the surface of the substrate.

28. The ESC structure of claim 21, wherein the one or more embedded electrodes comprise two electrodes, wherein the two electrodes comprise mesh layers embedded within the ceramic body being different from each other in at least one of (i) a shape and (ii) a density of the mesh layers.

29. The ESC structure of claim 21, further comprising cooling channels within a portion of the ceramic body and configured to facilitate a flow of coolant through a portion of the ceramic body, wherein the gas conduits further comprise a porous plug within at least one of the gas conduits, and wherein the ceramic body comprises a first material composition and, wherein porous plug comprises a second material composition.

30. The ESC structure of claim 23, wherein the transitional zone comprises:

two or more transitional sub-zones, each transitional sub-zone comprising a different material composition, wherein each material composition of the transitional sub-zone comprises a ratio between a first material composition of the cooling base and a second material composition of the ceramic body.

31. The ESC structure of claim 30, wherein each transitional sub-zone comprises a ceramic powder dispersed within a metallic matrix, wherein a volume of ceramic powder within the metallic matrix is different for each sub-zone of the two or more transitional sub-zones.

* * * * *